(12) United States Patent
Haddadi et al.

(10) Patent No.: US 11,813,546 B1
(45) Date of Patent: Nov. 14, 2023

(54) DEVICE WITH FLAPPING DISPLAY

(71) Applicant: SPIN MASTER LTD., Toronto (CA)

(72) Inventors: Amir Haddadi, Richmond Hill (CA);
Benjamin Elias Dermer, Toronto (CA);
Paul Andrew Reynolds, Toronto (CA);
Amrit Dhoot, Toronto (CA); Martin Labrecque, Toronto (CA)

(73) Assignee: SPIN MASTER LTD., Ontaro (CA)

( * ) Notice: Subject to any disclaimer, the term of this patent is extended or adjusted under 35 U.S.C. 154(b) by 0 days.

(21) Appl. No.: 18/054,130

(22) Filed: Nov. 9, 2022

Related U.S. Application Data

(60) Provisional application No. 63/397,786, filed on Aug. 12, 2022.

(51) Int. Cl.
*A63H 13/00* (2006.01)
*A63H 33/26* (2006.01)
(Continued)

(52) U.S. Cl.
CPC .............. *A63H 33/26* (2013.01); *A63H 5/00* (2013.01); *A63H 33/22* (2013.01); *H05B 47/155* (2020.01); *H05K 1/028* (2013.01); *H05K 1/16* (2013.01); *A63H 2200/00* (2013.01); *G06F 3/044* (2013.01); *G06F 3/0416* (2013.01); *G06F 3/165* (2013.01); *H05K 2201/08* (2013.01); *H05K 2201/10106* (2013.01)

(58) Field of Classification Search
CPC ........... A63F 13/825; A63F 2300/8058; A63H 13/02; A63H 2200/00; A63H 29/22; A63H 3/36; A63H 3/50; A63H 33/26; A63H 5/00; A63H 33/22; H05B 47/155; H05K 1/028; H05K 1/16
See application file for complete search history.

(56) References Cited

U.S. PATENT DOCUMENTS 6,213,871 B1  4/2001  Yokoi
6,626,728 B2 *  9/2003  Holt ...................... A63H 33/22
                                                      446/175

(Continued)

OTHER PUBLICATIONS

"FlexLED," Web page <https://hackaday.io/project/164585/logs>, Mar. 28, 2019-Oct. 9, 2020, retrieved on Jan. 13, 2023.

(Continued)

*Primary Examiner* — Justin L Myhr
(74) *Attorney, Agent, or Firm* — Aird & McBurney LP

(57) ABSTRACT

A toy includes a magnetically responsive member, a fulcrum member, a printed circuit board (PCB), a lid covering the PCB, an activation switch, a touch sensor, a motion sensor, an audio transducer, a signal generator and a controller. The flexible PCB includes an electromagnetic coil, and a plurality of light emitting diodes (LEDs). Opening of the lid actuates the activation switch, and in response, the controller controls the signal generator to generate a coil control signal for the electromagnetic coil to produce a magnetic field that interacts with the magnetically responsive member, to induce oscillatory flapping of the PCB. In response to detecting a touch signal from the controller, or a motion signal from the motion sensor, the controller also generates a LED control signal to control illumination of the LEDs while the PCB is flapping, and an audio control signal to control the audio transducer to output sound.

29 Claims, 27 Drawing Sheets

(51) Int. Cl.
*A63H 33/22* (2006.01)
*A63H 5/00* (2006.01)
*H05B 47/155* (2020.01)
*H05K 1/16* (2006.01)
*H05K 1/02* (2006.01)
*G06F 3/16* (2006.01)
*G06F 3/044* (2006.01)
*G06F 3/041* (2006.01)

(56) References Cited

U.S. PATENT DOCUMENTS

| | | | | |
|---|---|---|---|---|
| 8,814,625 | B1* | 8/2014 | Long | A63H 5/00 |
| | | | | 446/175 |
| 8,814,627 | B2* | 8/2014 | Hayakawa | A63F 13/215 |
| | | | | 446/297 |
| 9,784,417 | B1* | 10/2017 | Springer | F21V 23/006 |
| 10,912,232 | B2* | 2/2021 | Nakajima | H02M 7/003 |
| 2012/0013575 | A1* | 1/2012 | Sledge | G06F 3/0386 |
| | | | | 345/175 |
| 2012/0075285 | A1* | 3/2012 | Oyagi | A63F 13/65 |
| | | | | 345/419 |
| 2017/0106300 | A1* | 4/2017 | McDonald | A63H 13/02 |
| 2020/0026174 | A1* | 1/2020 | Morita | H04N 9/3182 |

OTHER PUBLICATIONS

Bugeja, Carl, "FlexLED—Flexing Light?", Web page <https://www.youtube.com/watch?v=WFdmsJZsbOQ>, Mar. 27, 2019, retrieved Jan. 13, 2023.

Bugeja, Carl, "Designing a Flexi-Rigid FlexLED (v2)", Web page <https://www.youtube.com/watch?v=aojxKRDbWJY>, Sep. 19, 2019, retrieved Jan. 13, 2023.

Bugeja, Carl, "Geekiest DIY Valentine's Gift?", Web page <https://www.youtube.com/watch?v=hwJElmvJpLY>, Feb. 13, 2020, retrieved Jan. 13, 2023.

Bugeja, Carl, "Holographic FlexLED", Web page <https://www.youtube.com/watch?v=wM_Byrv9iBI>, Feb. 2, 2020, retrieved Jan. 13, 2023.

Bugeja, Carl, "New FlexLED Concept?", Web page <https://www.youtube.com/watch?v=3xHlxTJz3cQ>, Oct. 8, 2020, retrieved Jan. 13, 2023.

* cited by examiner

DEVICE WITH FLAPPING DISPLAY

CROSS-REFERENCE TO RELATED APPLICATIONS

This application claims the benefit of U.S. Provisional Application 63/397,786, filed Aug. 12, 2022, the contents of which are incorporated herein by reference in their entirety.

FIELD

The present disclosure relates generally to electronic display devices and in particular to electronic toys that provide visual and audio output in response to user interaction, including opening of a lid of a toy, user touch, and movement of the toy.

BACKGROUND OF THE DISCLOSURE

The prior art includes electronic toys referred to as "digital pets" that provide visual and audio output in response to user interaction, to simulate companionship and development of a living pet. The toy marketed as Tamagotchi™ (Bandai Co, Ltd., Japan) is one example of a digital pet, with push buttons for user inputs, a liquid-crystal display screen for displaying images of the pet, and an audio transducer for producing sounds. There remains a need in the art for digital pets that provide the user with a three-dimensional display of the pet, and more tactile interaction with the pet.

SUMMARY OF THE DISCLOSURE

In a first aspect, the present invention comprises a toy that includes a magnetically responsive member, a base, a printed circuit board (PCB), at least one touch sensor, a signal generator, and a controller. The PCB includes an electromagnetic coil, and a plurality of light emitting diodes (LEDs). The LEDs are distributed in a first direction. The PCB is attached to the base such that the PCB is flappable relative to the base to oscillate the LEDs in a second direction at a non-zero angle relative to the first direction. The at least one touch sensor is for generating at least one touch signal when touched by a user. The signal generator is operatively connected to the electromagnetic coil to generate a coil control signal in the electromagnetic coil. The controller includes a processor operatively connected to the PCB, the at least one touch sensor, and the signal generator. The controller also includes a memory including a non-transitory computer readable medium. The memory stores a plurality of different LED illumination sequences for the plurality of LEDs, wherein each of the LED illumination sequences includes a series of illumination states for the LEDs. The memory also stores a set of instructions executable by the processor to implement a method. The method includes: (i) controlling the signal generator to generate the coil control signal in the electromagnetic coil to produce a time-varying varying magnetic field that interacts with the magnetically responsive member to induce oscillatory flapping of the PCB and the attached plurality of LEDs relative to the base; and (ii) in response to detecting the touch signal, and during step (i), generating a LED control signal to control illumination of the LEDs in accordance with at least one of the LED illumination sequences.

In embodiments of the toy of the first aspect, the PCB is a flexible PCB, the toy comprises a fulcrum member attached to the base, the flexible PCB is cantilevered from the fulcrum member, and the flexible PCB is flappable relative to the base by bending of the PCB relative to the fulcrum member. The base may define a substantially horizontal platform, wherein the fulcrum member extends upwardly from the platform. The toy may further include a clamp member horizontally spaced apart from the fulcrum member, and pressing the PCB downwardly against an upper surface of the platform and the fulcrum member. The clamp member may define a channel extending from above the platform to below the platform, wherein the PCB extends through the channel, and is attached to the processor disposed below the platform.

In embodiments of the toy of the first aspect, the PCB is either a flexible PCB or a rigid PCB, the PCB is pivotally attached to the base, the toy further includes a PCB spring for biasing the PCB either away from or toward the base, and the PCB is flappable relative to the base by pivoting relative to the base.

In embodiments of the toy of the first aspect, the magnetically responsive member is a permanent magnet.

In embodiments of the toy of the first aspect, the at least one touch sensor includes at least one capacitive touch sensor.

In embodiments of the toy of the first aspect, the method further includes selecting the at least one of the LED illumination sequences that is used in step (ii).

In embodiments of the toy of the first aspect, the at least one touch sensor includes a plurality of touch sensors. The method may include selecting the at least one of the LED illumination sequences that is used in step (ii) based on which of the touch sensors generated the touch signal.

In embodiments of the toy of the first aspect, in step (ii), the detected touch signal is indicative of the at least one touch sensor being touched with a swipe gesture, and/or the at least one touch sensor being touched for a pre-determined touch duration.

In embodiments of the toy of the first aspect, the at least one touch sensor includes at least one PCB-mounted touch sensor that is attached to the PCB such that, in use, the at least one PCB-mounted touch sensor flaps in unison with the PCB relative to the base. The at least one PCB-mounted touch sensor may be attached to an upward facing surface of the PCB.

In embodiments of the toy of the first aspect, the plurality of LEDs are disposed on a downward facing surface of the PCB.

In embodiments of the toy of the first aspect, the at least one touch sensor includes at least one fixed touch sensor that is fixedly attached to a part of the toy that is fixedly attached to the base.

In embodiments of the toy of the first aspect, the toy further includes a motion sensor for detecting motion of the toy, which may include a ball switch sensor. The method includes, in response to detecting a motion signal generated by the motion sensor, and during step (i), generating another LED control signal to control the plurality of LEDs to illuminate in accordance with another one of the LED illumination sequences. The method may include selecting the another one of the LED illumination sequences, which may be based on a type of motion indicated by the motion signal. The type of motion may include either a shaking motion or a tilting motion.

In embodiments of the toy of the first aspect, the toy includes an audio transducer, and the method stores a plurality of different audio files. The method includes, in response to detecting the touch signal generated by the at least one touch sensor, generating an audio control signal to control the audio transducer to output sound in accordance with one of the audio files. The method may further include selecting the one of the audio files.

In embodiments of the toy of the first aspect, the toy includes a lid movably attached to the base for moving between a closed position in which the lid covers the PCB to prevent the PCB being viewed from outside housing, and a fully open position in which the housing exposes the PCB to viewing from outside the housing. The toy optionally further comprises an activation switch actuatable by the processor from an off-state to a fully on-state by moving of the lid from the closed position to the fully open position. When the activation switch is in the fully on-state, the processor is programmed to carry out a first set of functions. The first set of functions may be a set of functions associated with ownership of the toy. For example, the first set of functions may include receiving input from the at least one touch sensor and generating the LED control signal to control illumination of the LEDs in accordance with a first one of the LED illumination sequences based on the input from the at least one touch sensor. Optionally, the activation switch is actuated from the off-state to a partially on-state by moving of the lid from the closed position to an angle of 10 degrees to 15 degrees from the closed position towards the fully open position, wherein, when the activation switch is in the partially on-state, the processor is programmed to carry out a second set of functions that is different than the first set of functions. The second set of functions may be a set of functions associated with a try-me mode for the toy, while the toy is not yet owned by the user (e.g. while the toy sits in a store prior to purchase). For example, the second set of functions may include generating the LED control signal to control illumination of the LEDs in accordance with a second one of the LED illumination sequences based on the input from the at least one touch sensor. Worded more broadly, the activation switch may be said to be actuatable from the off-state to a partially on-state by moving of the lid from the closed position to a partially open position, wherein, when the activation switch is in the partially on-state, the processor is programmed to carry out a second set of functions that is different than the first set of functions, wherein the activation switch is further actuatable to the fully on-state by moving the lid from the partially open position to the fully open position; and wherein the method further comprises, in response to detecting the activation switch being in the fully on-state, generating another LED control signal to control illumination of the LEDs in accordance with another one of the LED illumination sequences.

In embodiments, the lid may be pivotably attached to the base, in which case, the open position of the lid may correspond to the lid being pivoted by an angle of 10 degrees to 15 degrees from an orientation of the lid in the closed position. In embodiments, the toy may further include an activation switch actuatable from an off-state to an on-state by moving of the lid from the closed position to the open position. The processor is operatively connected to the activation switch, and in the method, step (i) is initiated in response to the activation switch being actuated to the on-state. In embodiments, the open position corresponds to a partially open position and the on-state corresponds to an intermediate on-state, and the activation switch is further actuatable to a fully on-state by moving the lid from the partially open position to a fully open position. In such embodiments, the method further includes, in response to detecting the activation switch being in the fully on-state, generating another LED control signal to control illumination of the LEDs in accordance with another one of the LED illumination sequences. In embodiments, the toy includes a lid spring that biases the lid to the closed position. In embodiments, the toy includes a spring-loaded latch pin insertable into at least one aperture of the lid to releasably retain the lid in either the closed position or the open position.

In embodiments of the toy of the first aspect, the plurality of LEDs includes at least 24 LEDs. The LEDs may be arranged in a row. In embodiments, the LEDs are multi-color LEDs, and the LED illumination states are defined at least by an illumination color of the LEDs. Additionally or alternatively, the LEDs are dimmable LEDs, and the LED illumination states are defined at least by an illumination brightness of the LEDs.

In embodiments of the toy of the first aspect, the electromagnetic coil includes a plurality of linear segments oriented in a plurality of different directions.

In embodiments of the toy of the first aspect, the base defines a substantially horizontal platform, wherein the PCB extends upwardly from the platform. The platform may define a platform recess that receives the LEDs to prevent contact between the LEDs and the platform when the PCB is at a lower extent of its oscillation relative to the base. The platform may, in use, be contacted by the PCB to limit a lower extent of its oscillation relative to the base.

In embodiments of the toy of the first aspect, in step (i) the oscillatory flapping of the PCB includes the PCB moving repeatedly in a first stroke direction followed by a second stroke direction opposite to the first stroke direction. In step (ii), the LED control signal is configured to illuminate the LEDs when the LEDs move in either the first stroke direction or the second stroke direction, but not both the first and second stroke directions. The first stroke direction may be an upstroke direction, and the second stroke direction may be a downstroke direction, or vice versa.

In embodiments of the toy of the first aspect, the PCB comprises an internal metal foil layer that overlaps the electromagnetic coil, and extends beyond a perimeter of the electromagnetic coil to dissipate heat from the electromagnetic coil to portions of the PCB beyond the perimeter of the electromagnetic coil.

In embodiments of the toy of the first aspect, the toy further comprises a temperature sensor attached to the PCB to measure a temperature of the PCB, and a circuit interrupter switch for interrupting the coil control signal to the coil. The processor is operatively connected to the temperature sensor and to the circuit interrupter switch. The method further comprises the processor controlling the circuit interrupter switch to interrupt the coil control signal to the coil in response to the temperature of the PCB or a rate of an increase the temperature of the PCB exceeding a predefined threshold limit.

In a second aspect, the present invention includes a toy that includes a magnetically responsive member, a substantially horizontal platform, a fulcrum member extending upwardly from the platform, a flexible printed circuit board (PCB), a signal generator, a clamp member, and a controller. The PCB includes an electromagnetic coil, and a plurality of light emitting diodes (LEDs). The LEDs are distributed in a first direction. The PCB is cantilevered from the fulcrum member such that the PCB is flappable relative to the fulcrum member to oscillate the LEDs in a second direction at a non-zero angle relative to the first direction. The signal generator is operatively connected to the electromagnetic coil to generate a coil control signal in the electromagnetic coil. The clamp member is horizontally spaced apart from the fulcrum member, and presses the PCB downwardly against an upper surface of the platform and the fulcrum member. The controller includes a processor operatively connected to the PCB and the signal generator. The controller also includes a memory including a non-transitory computer readable medium that stores a set of instructions executable by the processor to implement a method. The method includes: (i) controlling the signal generator to generate the coil control signal in the electromagnetic coil to produce a time-varying varying magnetic field that interacts with the magnetically responsive member to induce oscillatory flapping of the PCB and the attached plurality of LEDs relative to the fulcrum member; and (ii) during step (i), generating a LED control signal to control illumination of the LEDs.

In embodiments of the toy of the second aspect, the platform may define a platform recess that receives the LEDs to prevent contact between the LEDs and the platform when the PCB is at a lower extent of its oscillation relative to the fulcrum member. The clamp member may define a channel extending from above the platform to below the platform, wherein the PCB extends through the channel, and is attached to the processor disposed below the platform. The plurality of LEDs may be disposed on a downward facing surface of the PCB.

In a third aspect, the present invention includes a toy that includes a magnetically responsive member, a base, a printed circuit board (PCB), a lid, an activation switch, a signal generator and a controller. The printed circuit board (PCB) includes an electromagnetic coil, and a plurality of light emitting diodes (LEDs). The LEDs are distributed in a first direction. The PCB, which may be either a flexible PCB or a rigid PCB, is attached to the base such that the PCB is flappable relative to the fulcrum member to oscillate the LEDs in a second direction at a non-zero angle relative to the first direction. The lid is movably attached to the base for moving between a closed position in which the lid covers the PCB to prevent the PCB being viewed from outside lid, and a fully open position in which the lid exposes the PCB to viewing from outside the lid. The activation switch is actuatable from an off-state to an on-state by moving of the lid from the closed position to the open position. The signal generator is operatively connected to the electromagnetic coil to generate a coil control signal in the electromagnetic coil. The controller includes a processor operatively connected to the PCB, the activation switch, and the signal generator. The controller also includes a memory including a non-transitory computer readable medium that stores a set of instructions executable by the processor to implement a method. The method includes: (i) in response to the activation switch being actuated to the on-state, controlling the signal generator to generate the coil control signal in the electromagnetic coil to produce a time-varying varying magnetic field that interacts with the magnetically responsive member to induce oscillatory flapping of the PCB and the attached plurality of LEDs relative to the base; and (ii) during step (i), generating a LED control signal to control illumination of the LEDs.

In embodiments of the toy of the third aspect, the lid may be pivotably attached to the base, and the open position of the lid corresponds to the lid being pivoted by an angle of 10 degrees to 15 degrees from an orientation of the lid in the closed position. The toy may further include a lid spring that biases the lid to the closed position. The toy may further include a spring-loaded latch pin that releasably retains the lid in either the closed position or the open position. The open position may correspond to a partially open position and the on-state corresponds to an intermediate on-state. The activation switch may be further actuatable to a fully on-state by moving the lid from the partially open position to a fully open position. The method may further include, in response to detecting the activation switch being in the fully on-state, generating another LED control signal, different from the LED control signal, to control illumination of the LEDs.

In a fourth aspect, the present invention includes a toy that includes a magnetically responsive member, a base, a printed circuit board (PCB), a signal generator, and a controller. The PCB, which may either a flexible PCB or a rigid PCB, includes an electromagnetic coil, and a plurality of light emitting diodes (LEDs). The LEDs are distributed in a first direction. The PCB is attached to the base such that the PCB is flappable relative to the base to oscillate the LEDs in a second direction at a non-zero angle relative to the first direction. The signal generator is operatively connected to the electromagnetic coil to generate a coil control signal in the electromagnetic coil. The controller includes a processor operatively connected to the PCB and the signal generator. The controller also includes a memory including a non-transitory computer readable medium that stores a set of instructions executable by the processor to implement a method. The method includes: (i) controlling the signal generator to generate the coil control signal in the electromagnetic coil to produce a time-varying varying magnetic field that interacts with the magnetically responsive member to induce oscillatory flapping of the PCB and the attached plurality of LEDs relative to the base; wherein the oscillatory flapping of the PCB includes the PCB moving repeatedly in a first stroke direction followed by a second stroke direction opposite to the first stroke direction; and (ii) during step (i), generating a LED control signal to control illumination of the LEDs, wherein the LED control signal is configured to illuminate the LEDs when the LEDs move in either the first stroke direction or the second stroke direction, but not both the first and second stroke directions. In embodiments, the first stroke direction is an upstroke direction, and the second stroke direction is a downstroke direction, or vice versa.

In a fifth aspect, the present invention includes a toy that includes a magnetically responsive member, a base, a printed circuit board (PCB), a signal generator and a controller. The PCB, which may either a flexible PCB or a rigid PCB, includes an electromagnetic coil, and a plurality of light emitting diodes (LEDs). The LEDs are distributed in a first direction. The PCB is attached to the base such that the PCB is flappable relative to the base to oscillate the LEDs in a second direction at a non-zero angle relative to the first direction. The signal generator is operatively connected to the electromagnetic coil to generate a coil control signal in the electromagnetic coil. The controller includes a processor operatively connected to the PCB and the signal generator. The controller also includes a memory including a non-transitory computer readable medium that stores a set of instructions executable by the processor to implement a method. The method includes: (i) controlling the signal generator to generate the coil control signal in the electromagnetic coil to produce a time-varying varying magnetic field that interacts with the magnetically responsive member to induce oscillatory flapping of the PCB and the attached plurality of LEDs relative to the base; and (ii) during step (i), generating a LED control signal to control illumination of the LEDs. The base defines a substantially horizontal platform, wherein the PCB extends upwardly from the platform. The platform is, in use, contacted by the PCB to limit a lower extent of its oscillation relative to the base. In such embodiments, the platform may define a platform recess that receives the LEDs to prevent contact between the LEDs and the platform when the PCB is at the lower extent of its oscillation relative to the base.

In a sixth aspect, the present invention includes a toy that includes a magnetically responsive member, a base, a printed circuit board (PCB), a temperature sensor attached to the PCB to measure a temperature of the PCB, a circuit interrupter switch, a signal generator, and a controller. The PCB, which may either a flexible PCB or a rigid PCB, includes an electromagnetic coil, a plurality of light emitting diodes (LEDs), a temperature sensor, and a circuit interrupter switch. The LEDs are distributed in a first direction. The PCB is attached to the base such that the PCB is flappable relative to the base to oscillate the LEDs in a second direction at a non-zero angle relative to the first direction. The signal generator is operatively connected to the electromagnetic coil to generate a coil control signal in the electromagnetic coil. The controller includes a processor operatively connected to the PCB, the temperature sensor, the circuit interrupter switch and the signal generator. The controller also includes a memory including a non-transitory computer readable medium that stores a set of instructions executable by the processor to implement a method. The method includes: (i) controlling the signal generator to generate a coil control signal in the electromagnetic coil to produce a time-varying varying magnetic field that interacts with the magnetically responsive member to induce oscillatory flapping of the PCB and the attached plurality of LEDs relative to the base; (ii) during step (i), generating a LED control signal to control illumination of the LEDs; and (iii) controlling the circuit interrupter switch to interrupt the coil control signal to the coil in response to the temperature of the PCB or a rate of an increase the temperature of the PCB exceeding a predefined threshold value.

Embodiments of the toy of the first, second, third, fourth, fifth, or sixth aspects, may include features of any embodiment of the toys of any of the other aspects, as described above.

BRIEF DESCRIPTIONS OF THE DRAWINGS

For a better understanding of the various embodiments described herein and to show more clearly how they may be carried into effect, reference will now be made, by way of example only, to the accompanying drawings in which:

FIG. 1 is a top-front-right quarter perspective view of the toy, when the flexible PCB is at the lower extent of its oscillation;

FIG. 2 shows a top-front-right quarter perspective view of the toy, when the flexible PCB is at the upper extent of its oscillation;

FIG. 3 shows a top-front-left quarter perspective view of the toy, when a user's finger touches the touch sensor on the upward facing surface of the flexible PCB;

FIG. 4 is a top-front-right quarter perspective, medial sectional view of the toy;

FIG. 5 is a right side elevation view of the toy, when the flexible PCB is at the lower extent of its oscillation;

FIG. 6 is a right side elevation view of the toy, when the flexible PCB is at the lower extent of its oscillation;

FIG. 7 is a top-front-right quarter perspective view of the toy;

FIG. 8 is a right elevation, sectional view of the toy along a vertical plane passing through line A-A of FIG. 7;

FIG. 9 is a top-front-right quarter perspective view of the toy;

FIG. 10 is a top-rear-left quarter perspective view of the toy;

FIG. 11 is a bottom-front-left quarter perspective view of the toy;

FIG. 12 is a bottom-rear-right quarter perspective view of the toy;

FIG. 13 is a bottom-rear-left quarter view of the inner part of the lid;

FIG. 14 is a top-rear-right corner perspective view of the base;

FIG. 15 is a top-right perspective, medial sectional view of the platform, a fulcrum member, a clamp member, and the flexible PCB;

FIG. 16 is a bottom plan view of an embodiment of a flexible PCB;

FIG. 17 is a sectional view of the free end of the flexible PCB of FIG. 16 at an enlarged scale, along line XVII of FIG. 16;

FIG. 18 is a bottom-front-left perspective view of the lid and activation switch, when the lid is in the closed position;

FIG. 19 is a bottom-front-left perspective view of the lid and activation switch, when the lid is in the fully open position;

FIG. 20 is a top-front-right quarter perspective view of the flexible PCB attached to the rigid PCB of the controller;

FIG. 25A shows a user opening the lid to reveal the flapping LEDs displaying an animation of a pet dog, accompanied by an audible "Ruff" greeting;

FIG. 25B shows a user touching a touch sensor that is attached to the PCB, to trigger the flapping LEDs to display an animation of a pet dog emoting affection;

FIG. 25C shows a user touching a touch sensor attached to the base with a swipe gesture to change the image of a treat or toy displayed by the flapping LEDs;

FIG. 25D shows a user touching a touch sensor that is attached to the PCB with a swipe gesture, to trigger the flapping LEDs to display an animation of a pet dog playing with a hula hoop, and the audio transducer to output an audible reading of "Let's Hula!";

FIG. 25E shows a user shaking the toy to trigger the audio transducer to output an audible reading of "Whoaa!" before the lid is opened, and to trigger the flapping LEDs to display an animation of a pet dog emoting a sad face, and the audio transducer to output an audible reading of "Grrr . . . " after the lid is opened;

FIG. 25F shows a user tiling the toy left-to-right or back-and-forth, to trigger the flapping LEDs to display an animation of a dancing pet dog, and the audio transducer to output audible music after the lid is opened;

FIG. 27 is a top-front-left quarter perspective view of the toy, omitting part of the base, when the lid thereof is in the fully open position;

FIG. 28 is a left side, medial sectional view of the toy, omitting part of the base, when the lid thereof is in the fully open position, and showing the range of motion of the flexible PCB;

FIG. 29 is a left side medial sectional view of the toy, when the lid thereof is in the closed position.

DETAILED DESCRIPTION

Figure 1:
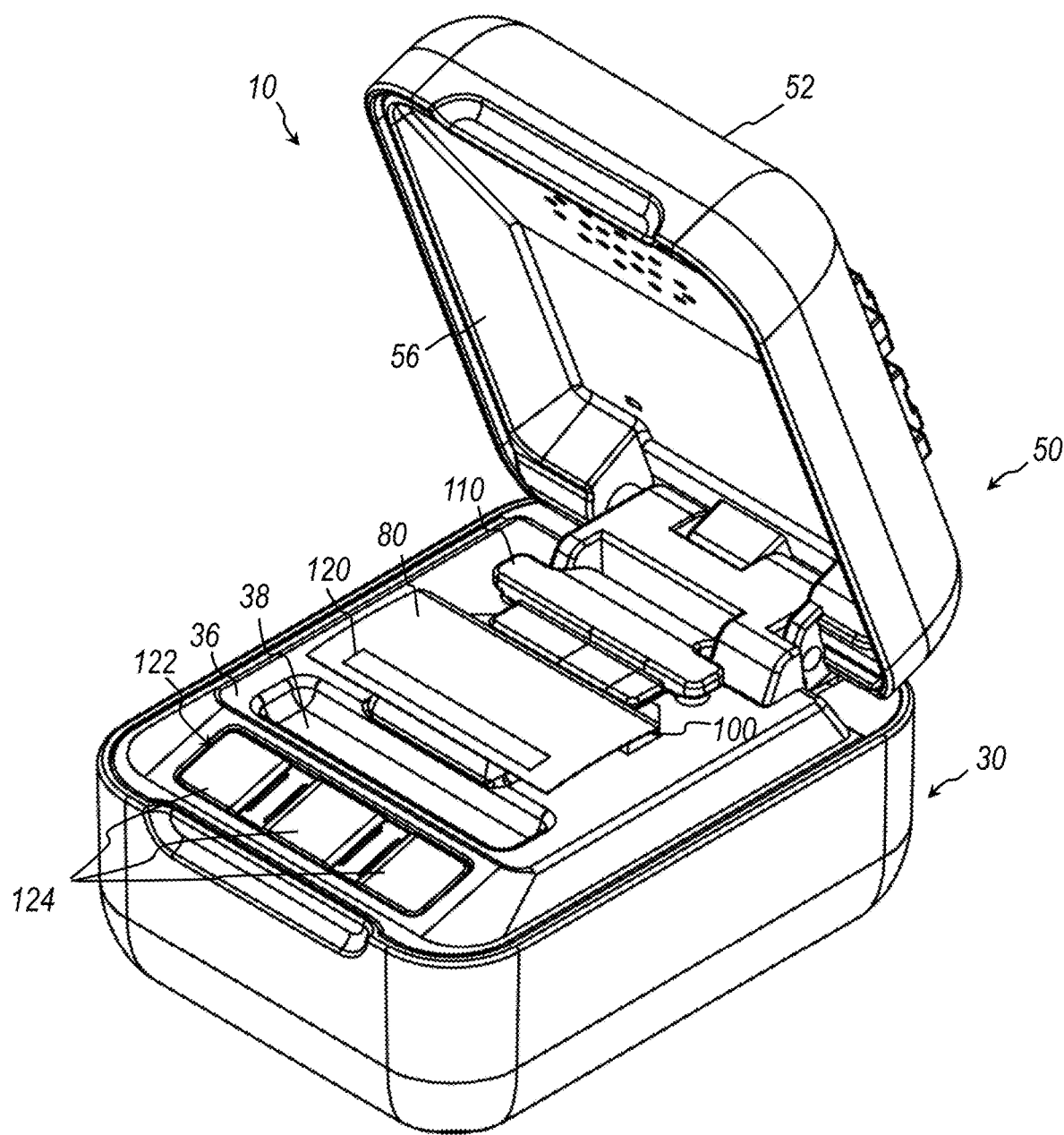
FIGS. 1 to 6 show views of a non-limiting embodiment of a toy of the present invention, when the lid thereof is in a fully open position.
Figure 2:
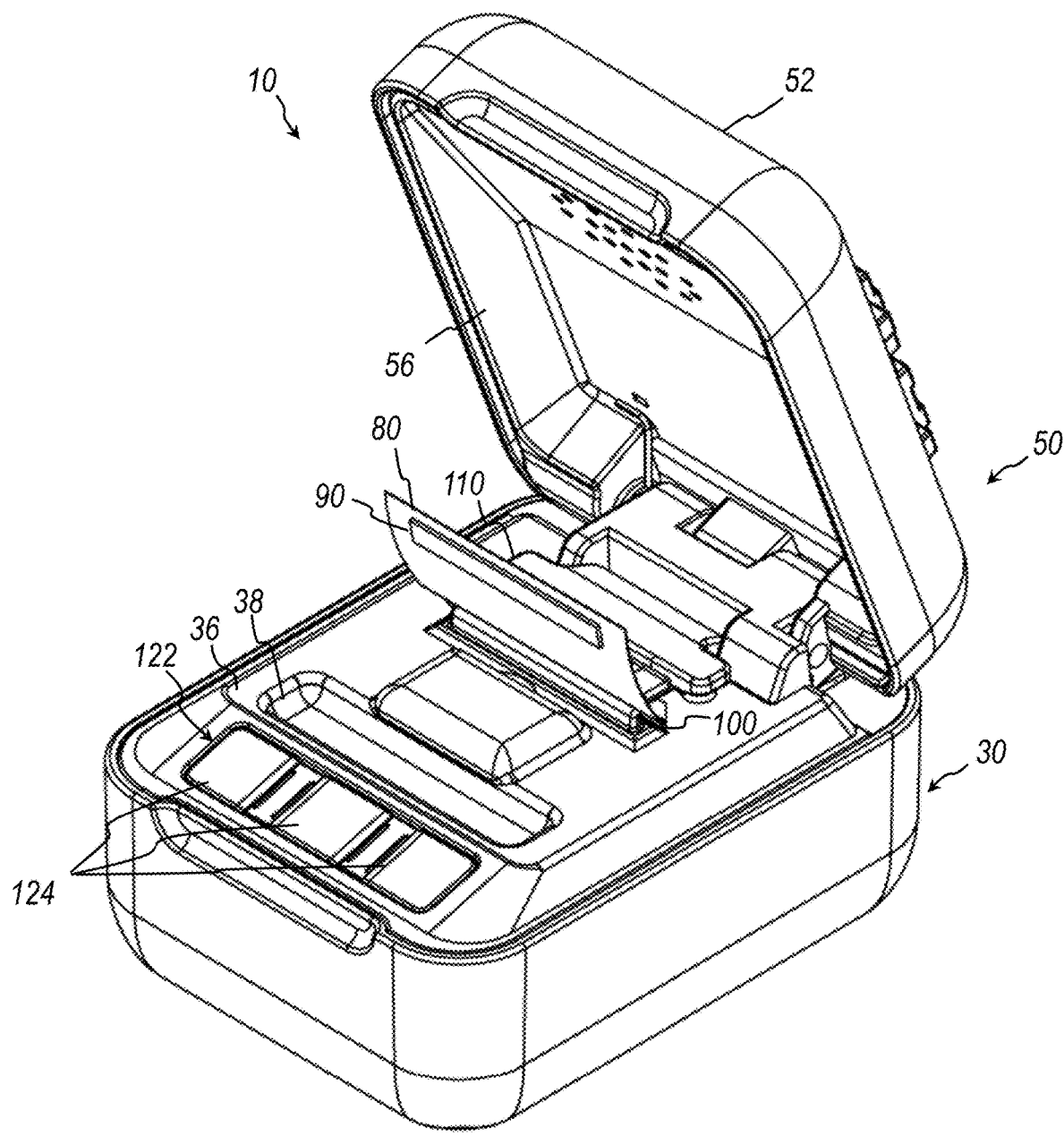

Interpretation.

For simplicity and clarity of illustration, where considered appropriate, reference numerals may be repeated among the Figures to indicate corresponding or analogous elements. In addition, numerous specific details are set forth in order to provide a thorough understanding of the embodiment or embodiments described herein. However, it will be understood by those of ordinary skill in the art that the embodiments described herein may be practiced without these specific details. In other instances, well-known methods, procedures and components have not been described in detail so as not to obscure the embodiments described herein. It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns such that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description. It will also be noted that the use of the term "a" or "an" will be understood to denote "at least one" in all instances unless explicitly stated otherwise or unless it would be understood to be obvious that it must mean "one".

Modifications, additions, or omissions may be made to the systems, apparatuses, and methods described herein without departing from the scope of the disclosure. For example, the components of the systems and apparatuses may be integrated or separated.

Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

As used in this document, "attached" in describing the relationship between two connected parts includes the case in which the two connected parts are "directly attached" with the two connected parts being in contact with each other, and the case in which the connected parts are "indirectly attached" and not in contact with each other, but connected by one or more intervening other part(s) between.

"Memory" refers to a non-transitory tangible computer-readable medium for storing information in a format readable by a processor, and/or instructions readable by a processor to implement an algorithm. The term "memory" includes a plurality of physically discrete, operatively connected devices despite use of the term in the singular. Non-limiting types of memory include solid-state, optical, and magnetic computer readable media. Memory may be non-volatile or volatile. Instructions stored by a memory may be based on a plurality of programming languages known in the art, with non-limiting examples including the C, C++, Python™, MATLAB™, and Java™ programming languages.

"Processor" refers to one or more electronic devices that is/are capable of reading and executing instructions stored on a memory to perform operations on data, which may be stored on a memory or provided in a data signal. The term "processor" includes a plurality of physically discrete, operatively connected devices despite use of the term in the singular. Non-limiting examples of processors include devices referred to as microprocessors, microcontrollers, microcontroller units (MCU), central processing units (CPU), and digital signal processors.

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor, such that the processor, and a memory storing the instructions, which execute via the processor, collectively constitute a machine for implementing the functions/acts specified in the flowchart and/or block diagram block or blocks.

The flowcharts and functional block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments of the inventions described herein are exemplary (e.g., in terms of materials, shapes, dimensions, and constructional details) and do not limit by the claims appended hereto and any amendments made thereto. Persons skilled in the art will appreciate that there are yet more alternative implementations and modifications possible, and that the following examples are only illustrations of one or more implementations. The scope of the invention, therefore, is only to be limited by the claims appended hereto and any amendments made thereto.

Toy.

Figure 26:
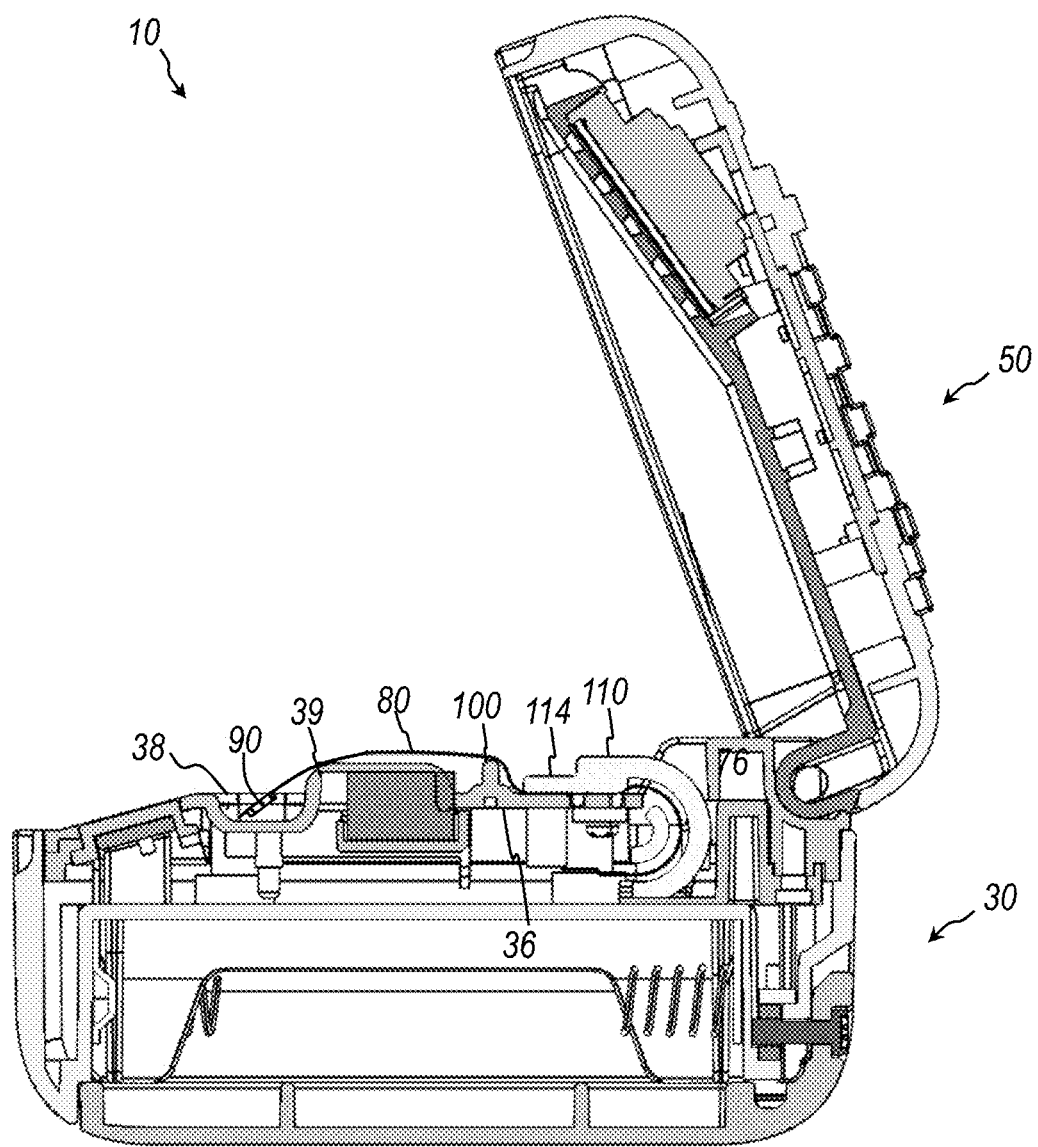
FIG. 26 is a right side, medial sectional view of another embodiment of the toy of the present invention, when the flexible PCB is at the lower extent of its oscillation.
Figure 27:
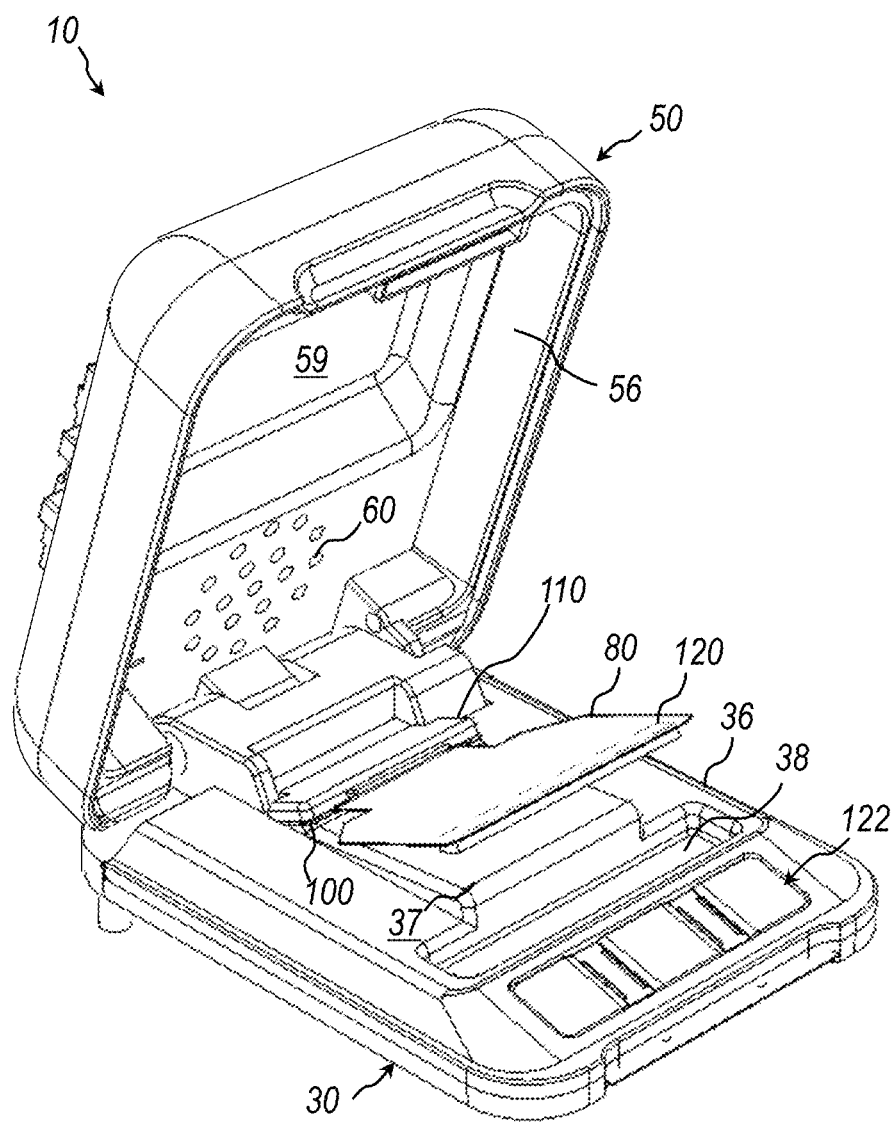
FIGS. 27 to 29 show views of another non-limiting embodiment of a toy of the present invention.
Figure 28:
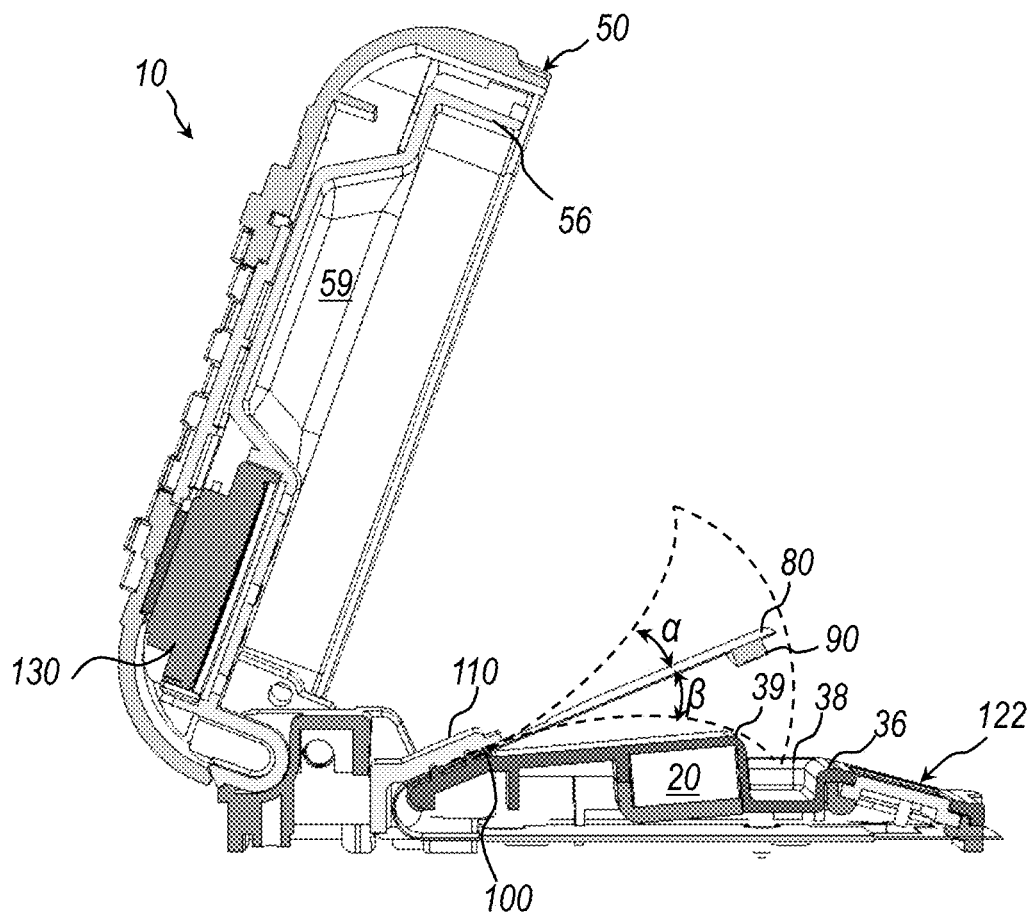
Figure 29:
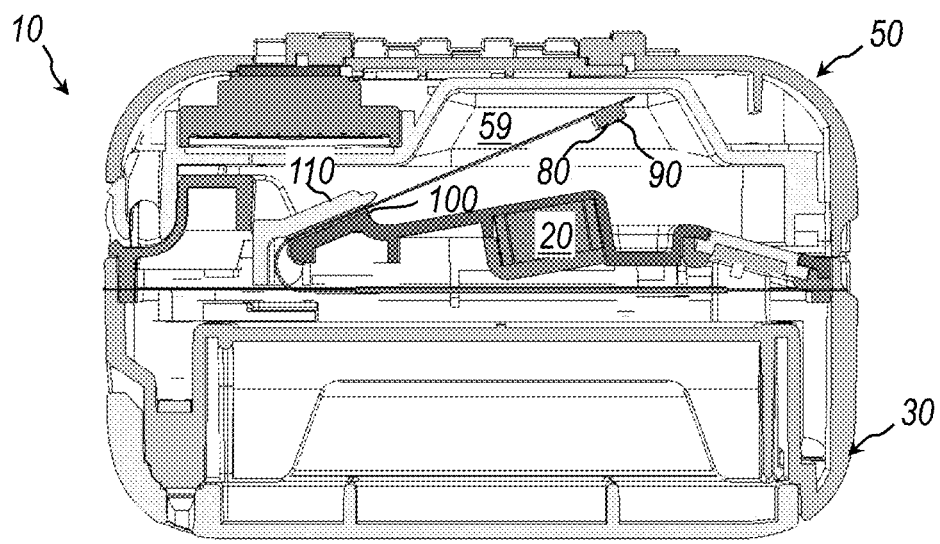
Figure 30:
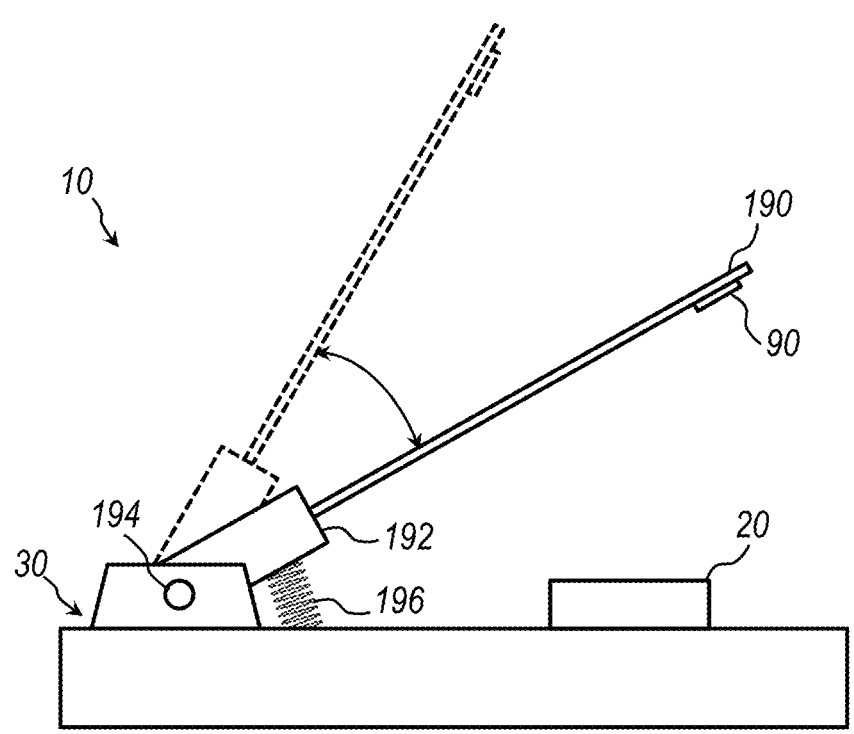
FIG. 30 is a left elevation view of another non-limiting embodiment of the toy of the present invention having a PCB with LEDs, pivotally attached to a base.

In one aspect, the present disclosure is directed to a toy 10, as shown in one embodiment in various views in FIGS. 1 to 12, with parts thereof shown in FIGS. 13 to 20. FIG. 26 shows a second embodiment of the toy 10; FIGS. 27 to 29 show a third embodiment of the toy 10; and FIG. 30 shows a fourth embodiment of the toy. In the embodiments shown, common reference numbers are used to label analogous parts. Any one of the embodiments of the toy 10 may be modified with any one or a combination of features of another embodiment of the toy 10.

Figure 16:
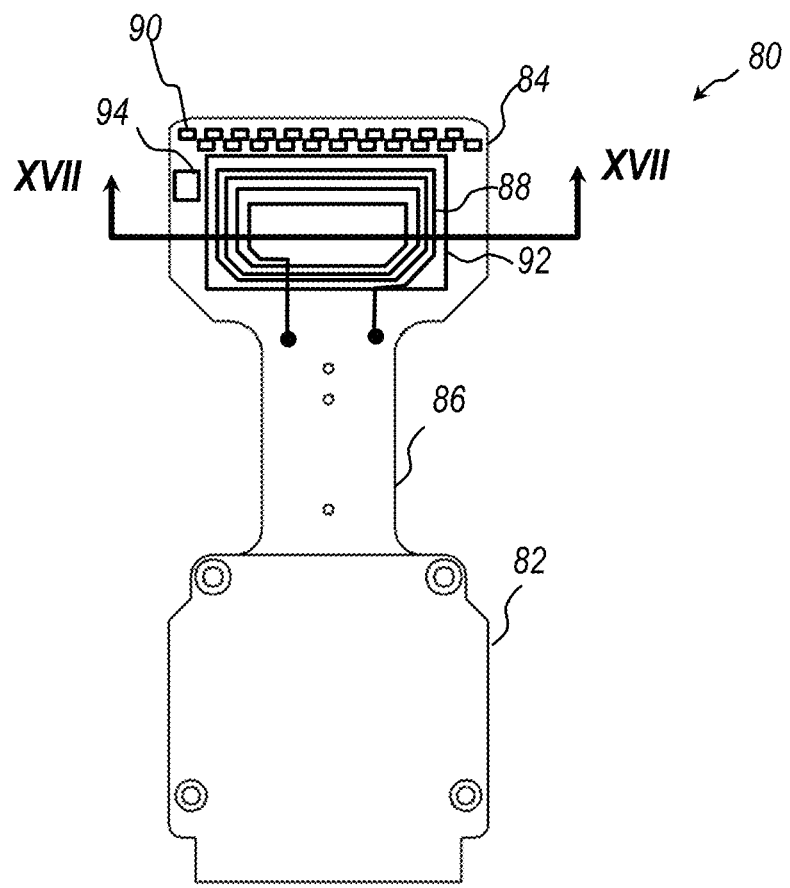
Figure 17:
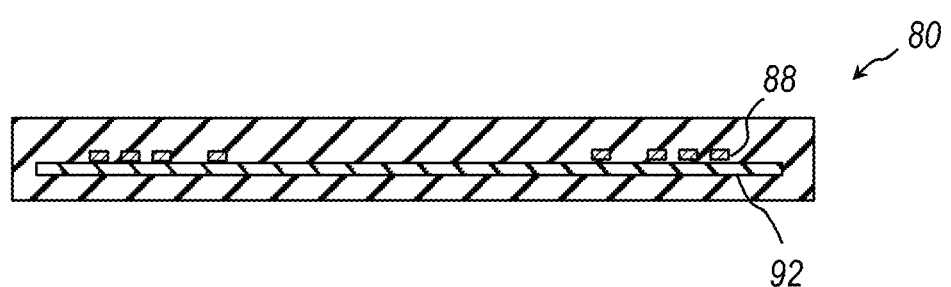
Figure 20:
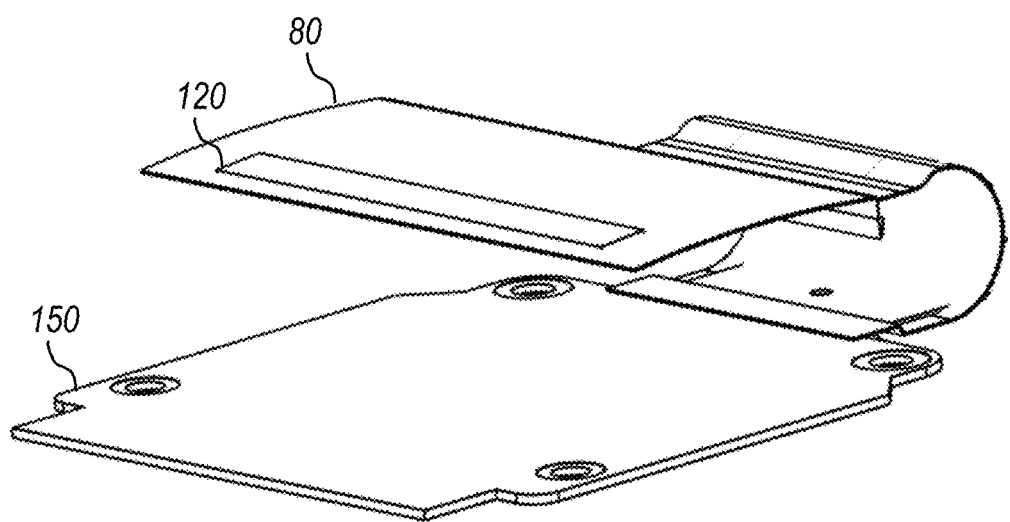
Figure 21:
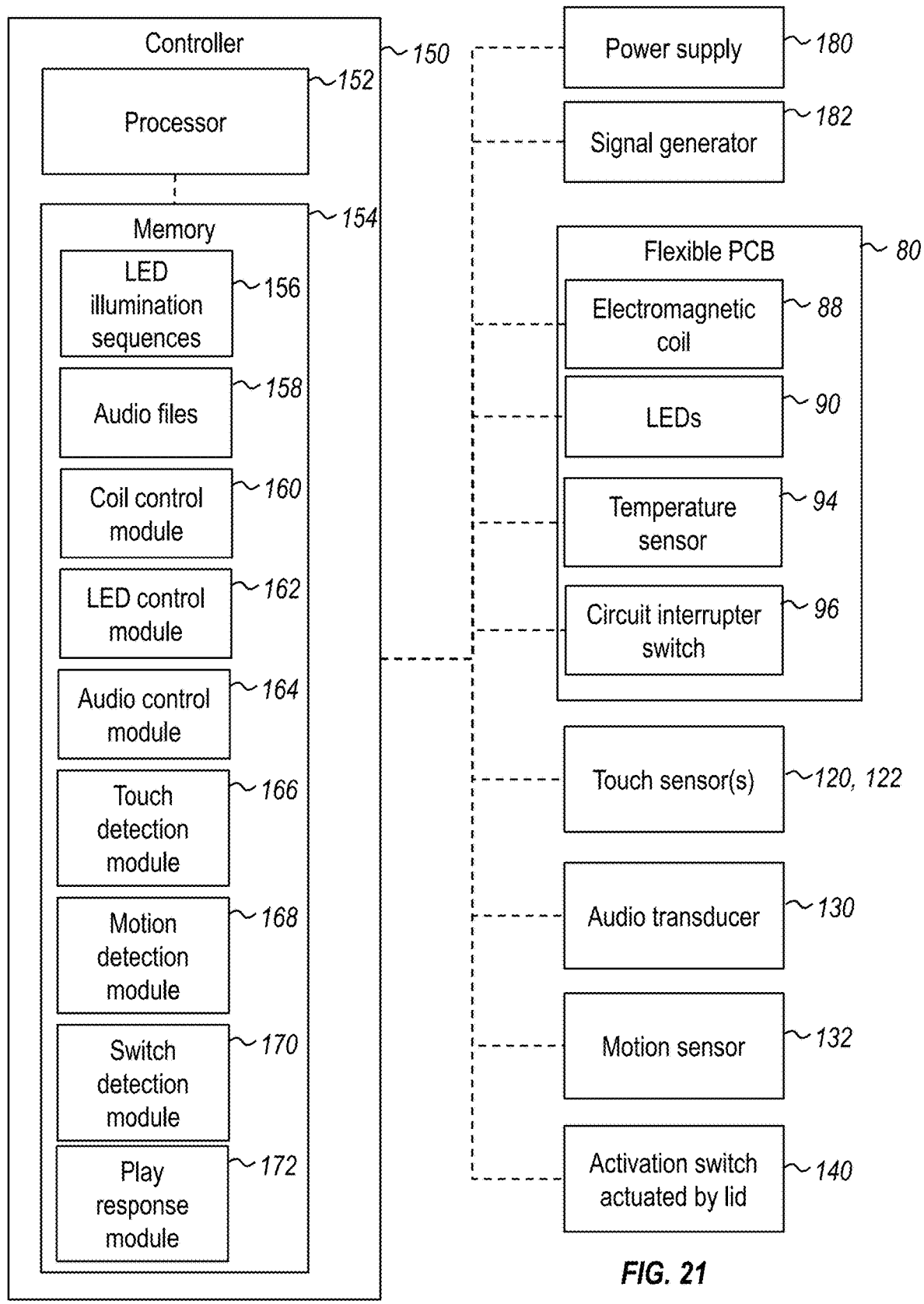
FIG. 21 is a functional block diagram of electronic components of an embodiment of a toy of the present invention.

Referring to FIGS. 1 to 4, the toy 10 includes a magnetically responsive member (FIG. 4), a base 30, a lid 50, a flexible PCB 80, a fulcrum member 100, a clamp member 110, touch sensors 120, 122, and an audio transducer 130. FIGS. 16 and 17 are bottom views of the flexible PCB 80 showing its electromagnetic coil 88 and a plurality of light emitting diodes (LEDs) 90. FIG. 20 shows the flexible PCB 80 operatively connected to a rigid PCB forming a controller 150. FIG. 21 shows a block diagram of electronic components of the toy 10, including the controller 150 having a processor 152 and a memory 154, operatively connected to a power supply 180, a signal generator 182, the coil 88, LEDs 90, and the temperature sensor 94 of the PCB 80, the touch sensors 120, 122, the audio transducer 130, a motion sensor 132, and an electromechanical activation switch 140 actuated by the lid 50. These and other constituent parts of this embodiment of the toy 10 are described below in greater detail.

Magnetically Responsive Member.

Figure 4:
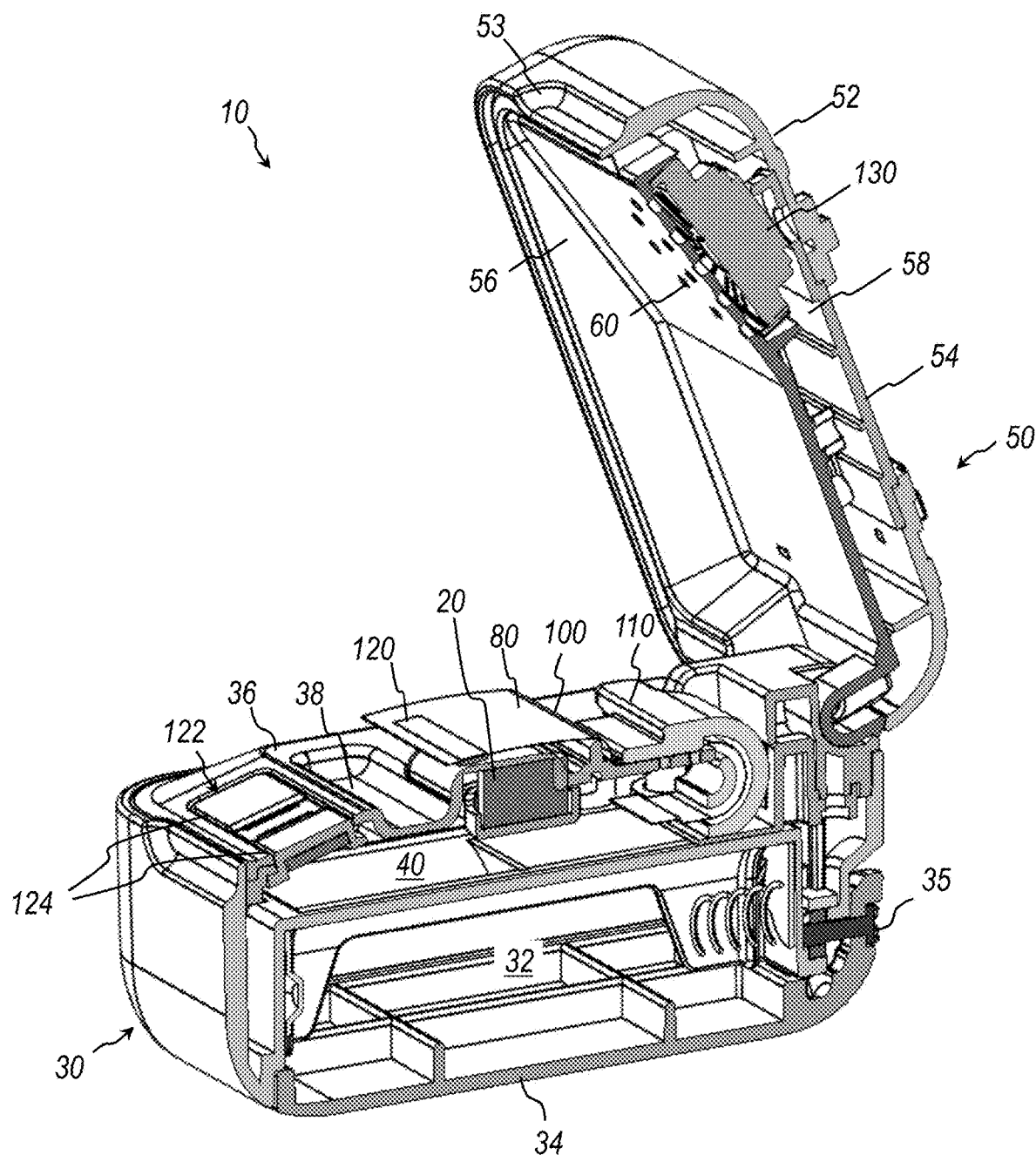
Figure 31:
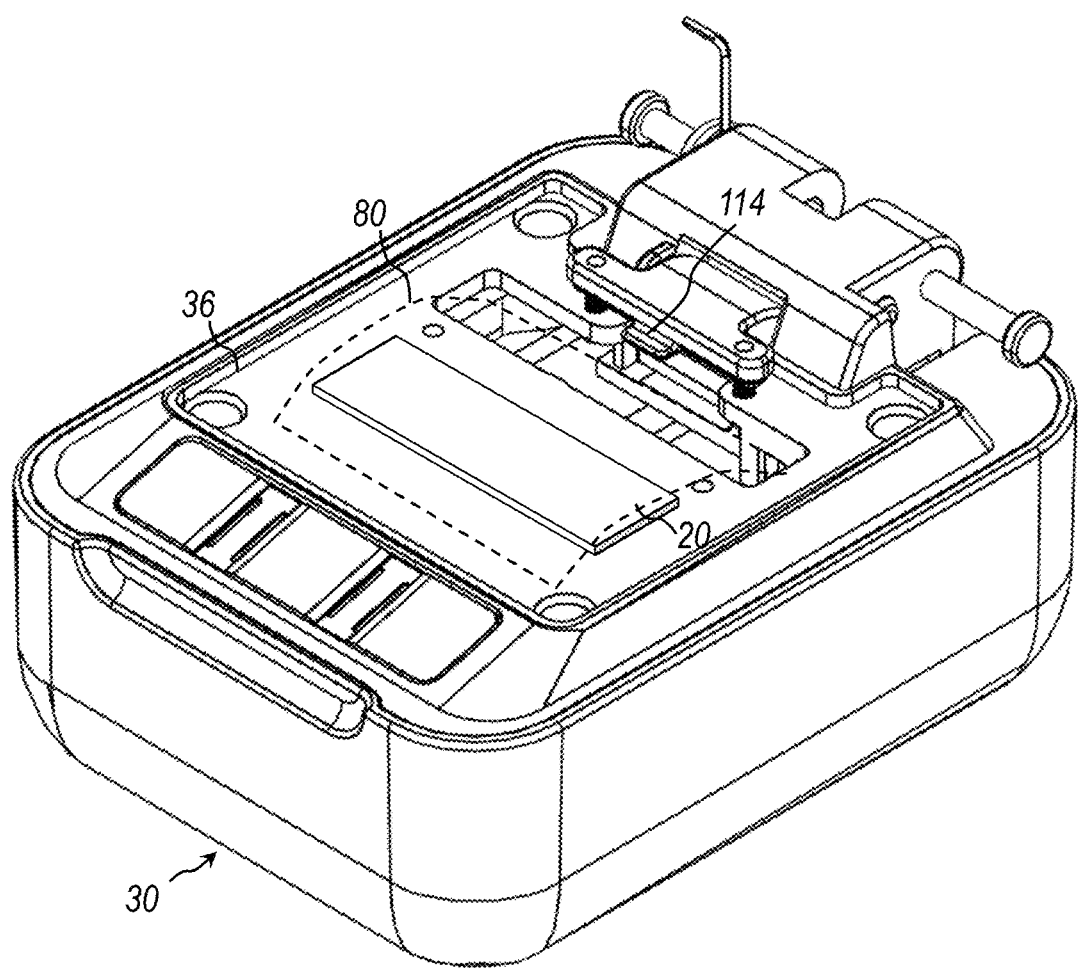
FIG. 31 is a top-right-front quarter perspective view of another non-limiting embodiment of the toy of the present invention, with the lid and part of the platform removed to show a magnetically responsive member that extends across substantially the entire width of the PCB.

The magnetically responsive member 20 is used in conjunction with the electromagnetic coil 88 to induce an oscillatory flapping motion of the PCB 80. The magnetically responsive member 20 may have any suitable structure. For example, the magnetically responsive member may be a permanent magnet formed with a variety of suitable materials, such as, for example, ferromagnetic metals, such as nickel or iron. In other embodiments, the magnetically responsive member may be, for example an electromagnet. In the embodiment shown in FIG. 4, the magnetically responsive member is a permanent magnet, having a cylindrical shape, which is disposed in a recess defined by the underside of the platform 36 of the base 30, and secured therein by a retaining member that is attached to the underside of the platform 36. In other embodiments as shown in FIG. 31, the magnetically responsive member 20 may extend horizontally substantially across the width of the PCB 80 (shown as transparent in dashed line), or a plurality of magnetically responsive members 20 may be distributed substantially across the width of the PCB 80. In comparison with a magnetically responsive member 20 that is localized near the mid-width of the PCB as shown in FIG. 4, the arrangement of magnetically responsive member(s) 20 shown in FIG. 31 may help to balance the magnetic field across the width of the PCB 80 to prevent warping or lateral shifting of the PCB 80 when it flaps. In embodiments, the magnetically responsive member 20 is a permanent magnet have a permanent magnetic field. In other embodiments, the magnetically responsive member 20 is an electromagnet.

Base.

Figure 8:
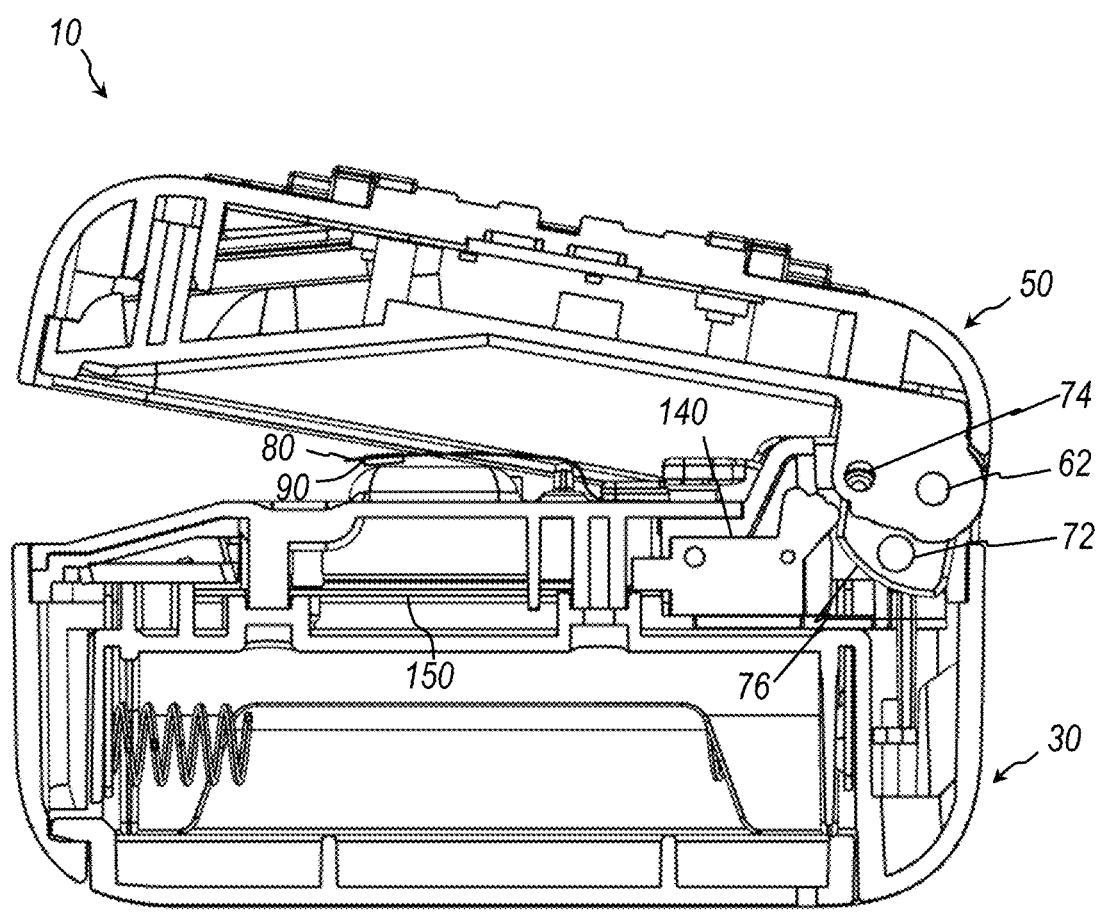
Figure 9:
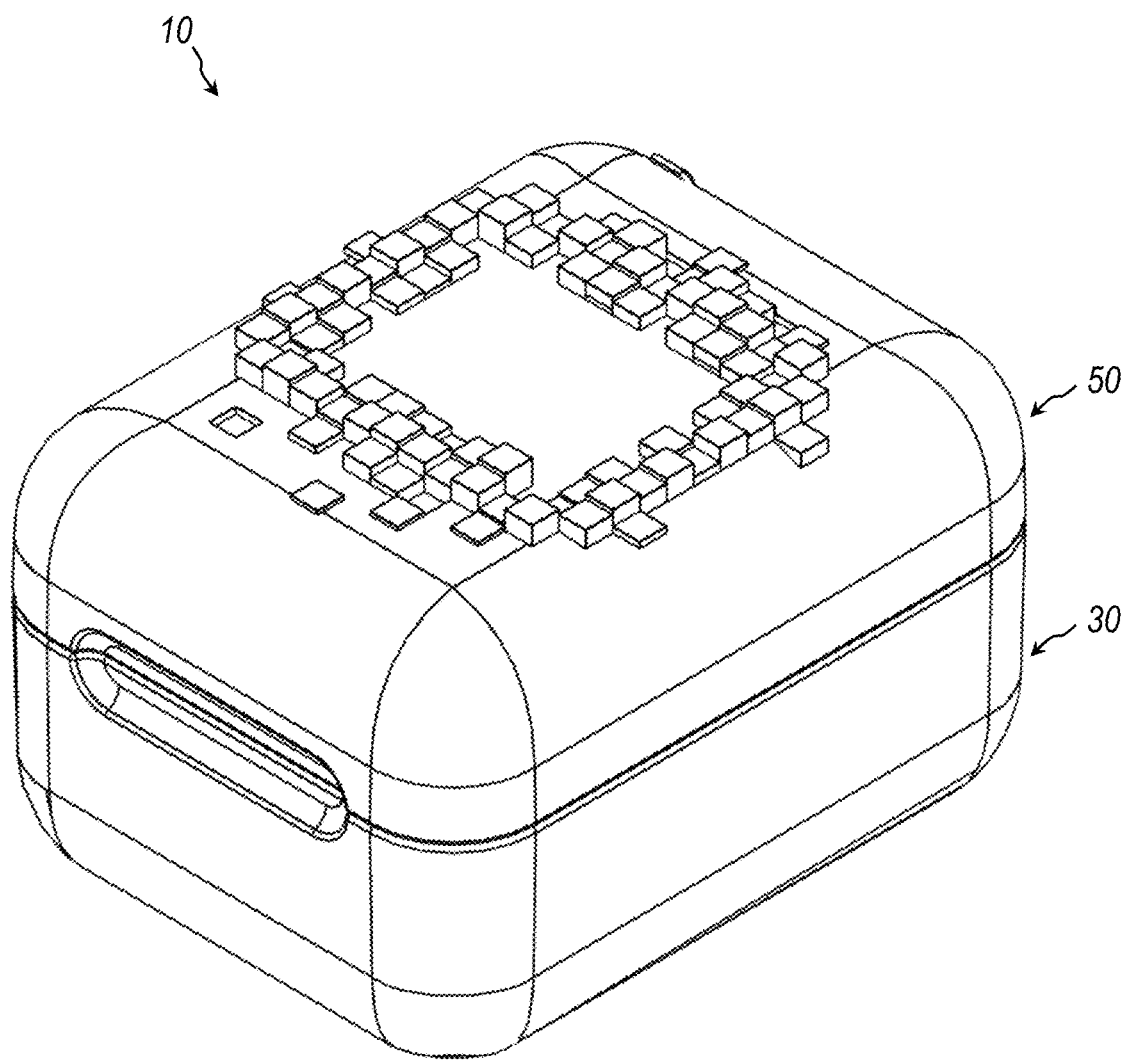
FIGS. 9 to 12 show views of the toy of FIG. 1, when the lid thereof is closed.
Figure 10:
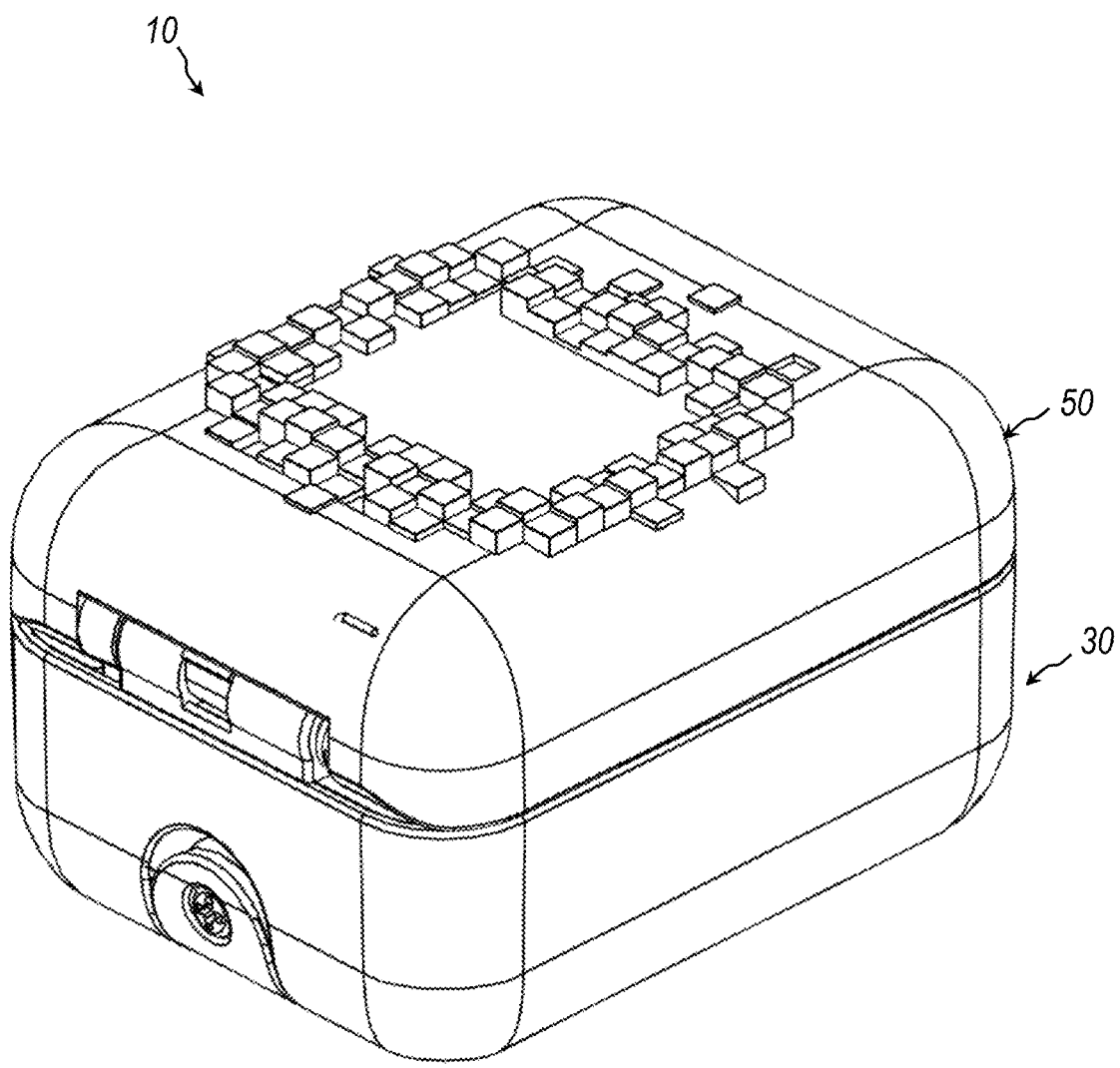
Figure 11:
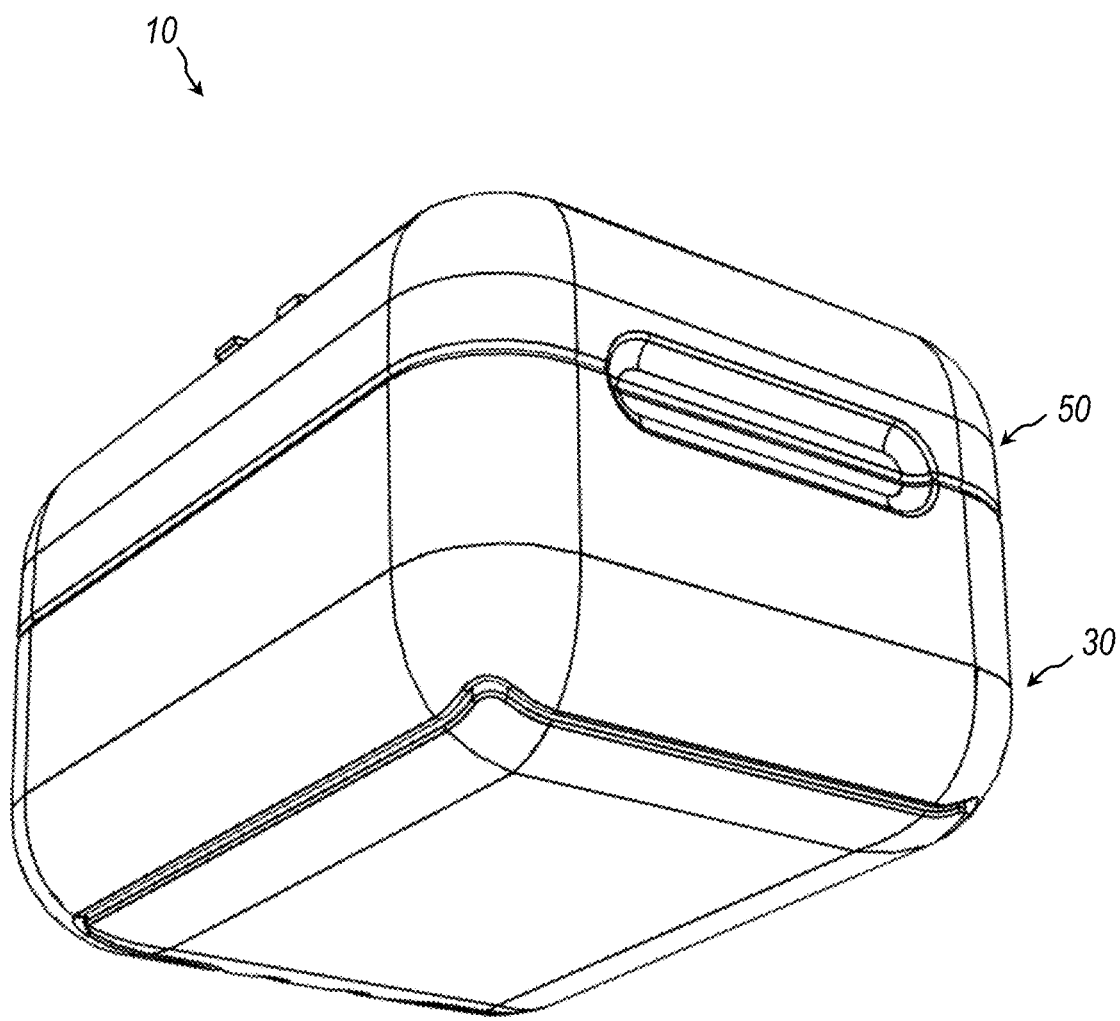
Figure 12:
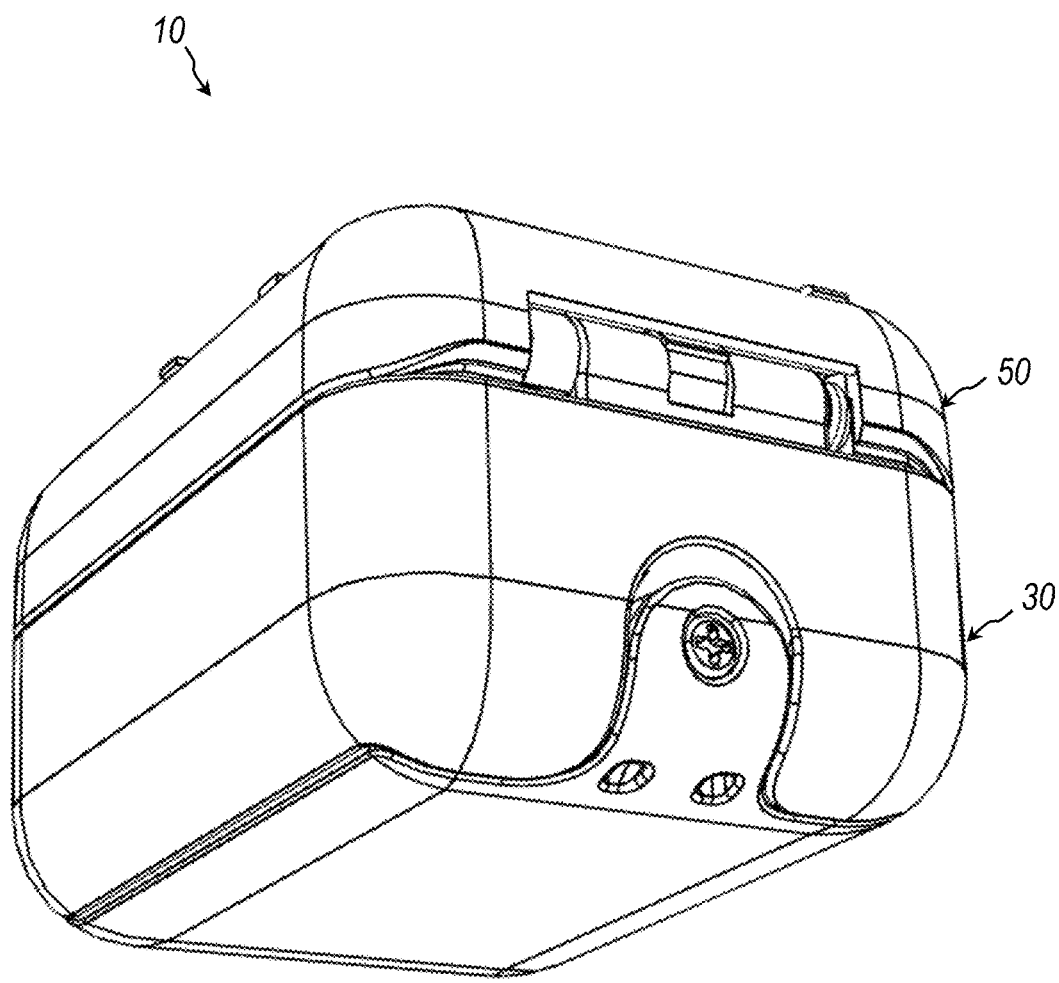

The toy 10 includes a base 30 that supports the toy 10 as a whole. Referring to FIG. 4, the lower portion of the base 30 defines a battery compartment 32 with battery contacts to accommodate a pair of "AA" sized batteries, which are used as the power supply 180 (FIG. 21) for the electronic components of the toy 10. The base 30 includes a battery compartment cover 34 that is removably attached to the remainder of the base 30 by a screw 35. The middle portion of the base 30 defines a compartment 40 for containing the controller 150 as shown in FIG. 8. The upper portion of the base 30 is terminated by a substantially horizontal stage-like platform 36. The upper surface of the platform 36 defines a platform recess 38 so as to prevent the LEDs 90 of the PCB 80 from impacting the platform 36, as such impacts may damage the LEDs 90 and make noise. FIG. 26 shows another embodiment of the toy 10 that is the same as the toy 10 shown in FIG. 1, except that the PCB 80 has a greater length such that LEDs 90 of the PCB 80 are received within the platform recess 38 at the lower extent of the oscillation of the PCB 80.

Lid.

Figure 5:
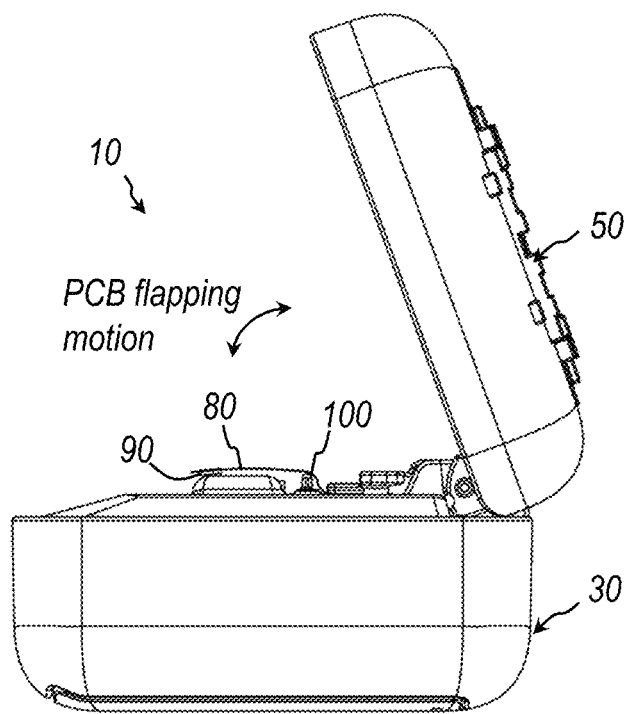
Figure 6:
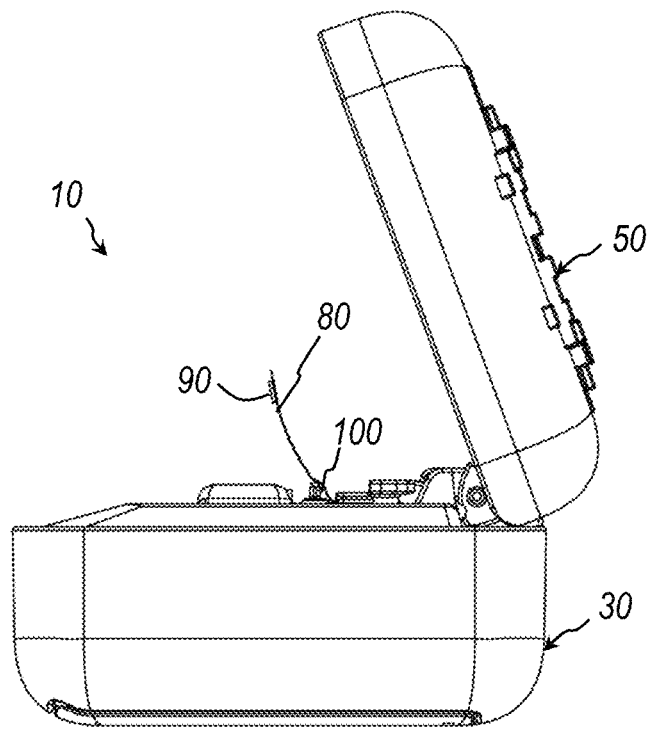
Figure 7:
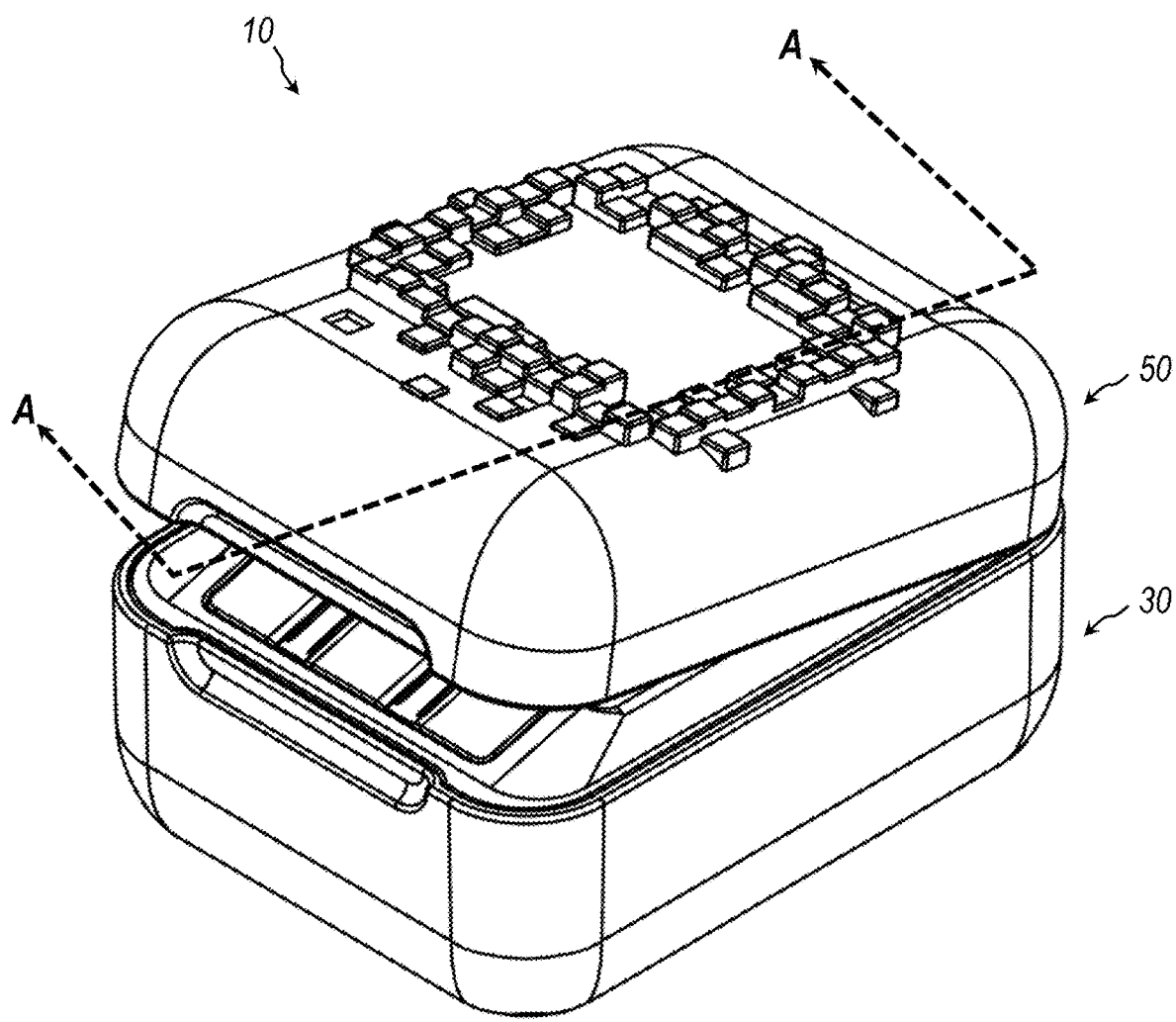
FIGS. 7 to 8 show views of the toy of FIG. 1, when the lid thereof is in a partially open position.

The lid 50 is attached to the base 30 so as to be movable between a closed position and a fully open position. When the lid 50 is in the fully open position, as shown in FIGS. 1 to 6, the lid 50 exposes the PCB 80 to being viewed and touched by the user. When the lid 50 is in a partially open position, as shown in FIGS. 7 and 8, the gap between the base and the lid 50 is large enough to allow the PCB 80 to be viewed by the user, but may be small enough to prevent a child's finger from passing through to touch the PCB 80. When the lid 50 is in the closed position, as shown in FIGS. 9 to 12, the lid 50 covers the PCB 80 to prevent the PCB 80 from being touched by the user. In the embodiment shown, the lid 50 is made of an opaque material (plastic), and therefore the lid 50 also conceals the PCB 80 from view when the lid 50 is in the closed position.

Referring to FIG. 4, in this embodiment, the lid 50 is made of three parts: an outer shell 52, an insert 54, and an inner layer 56. The outer shell 52 and the insert 54 are primarily decorative in function. The outer shell 52 defines a finger recess 53 for receiving a finger tip to facilitate opening of the lid 50. The insert 54 is attached to the inner surface of the outer shell 52, and is visible from the exterior of the toy 10 through an aperture defined by the outer shell 52. The lid 50 defines a compartment 58 between the outer shell 52 and the inner layer 56 that contains the audio transducer 130. The inner layer 56 defines a plurality of apertures 60 (FIG. 4) for sound transmission from the audio transducer 130. Preferably, as shown in the embodiment of FIGS. 27 to 29, the inner layer 56 defines a downward facing inner recess 59 that receives the PCB 80, without contacting the PCB 80. Accordingly, when the lid 50 is in the closed position, a clearance exists between the inner layer 56 and the PCB 80 such that the inner layer 56 does not impinge on the PCB 80, as prolonged impingement may permanently deform the PCB 80 and impair its flapping performance.

Figure 13:
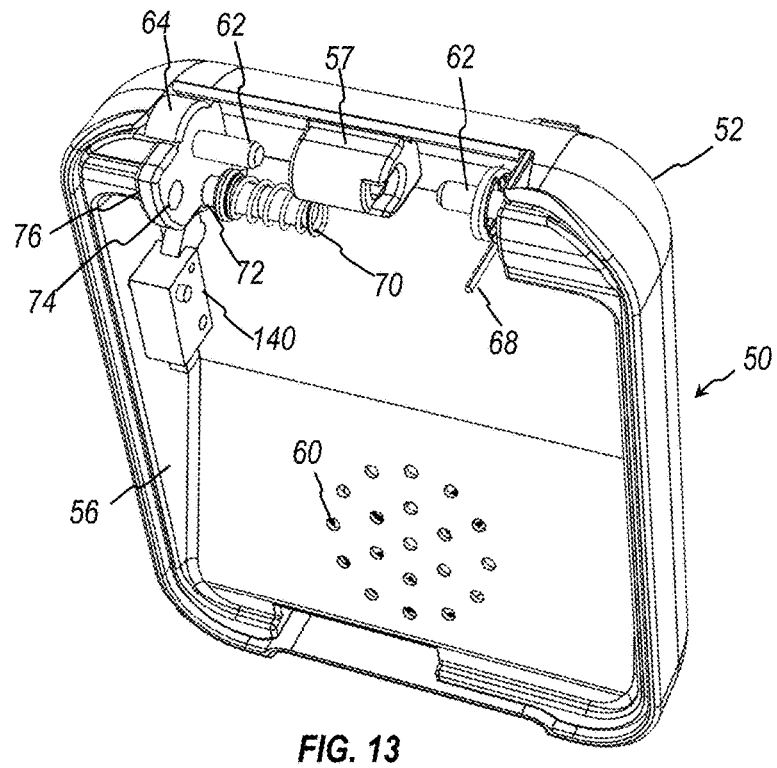
FIGS. 13 to 20 show parts of the toy of FIG. 1.
Figure 14:
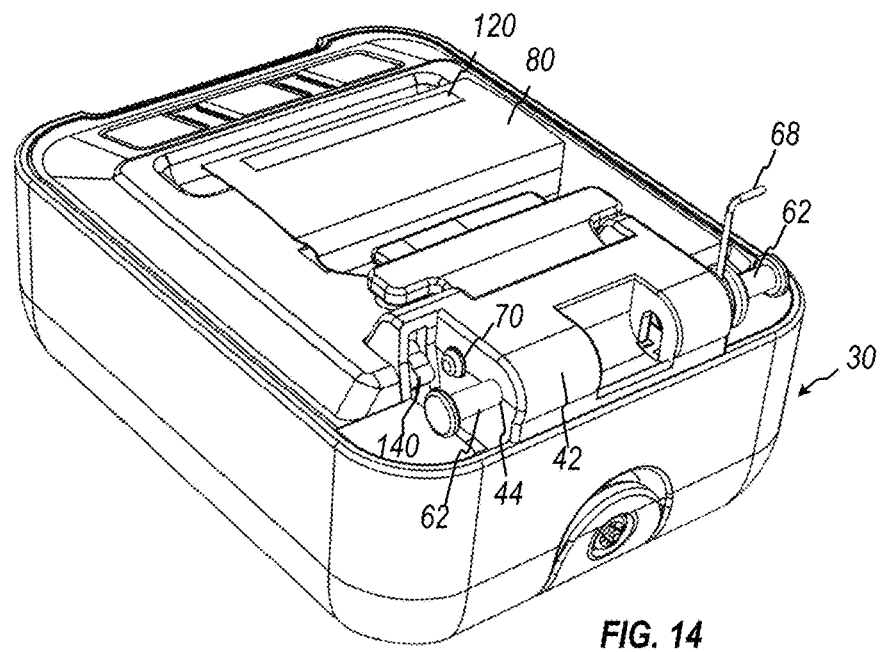
Figure 18:
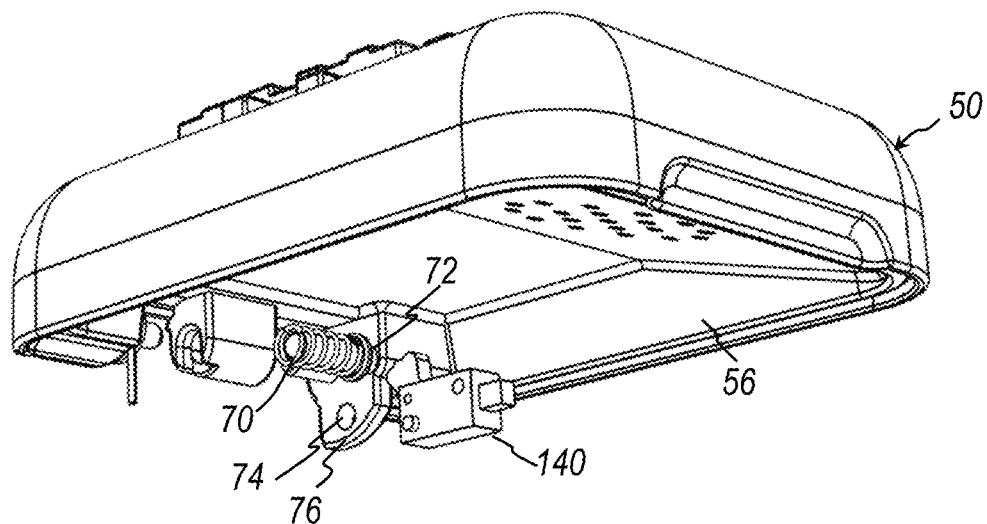
Figure 19:
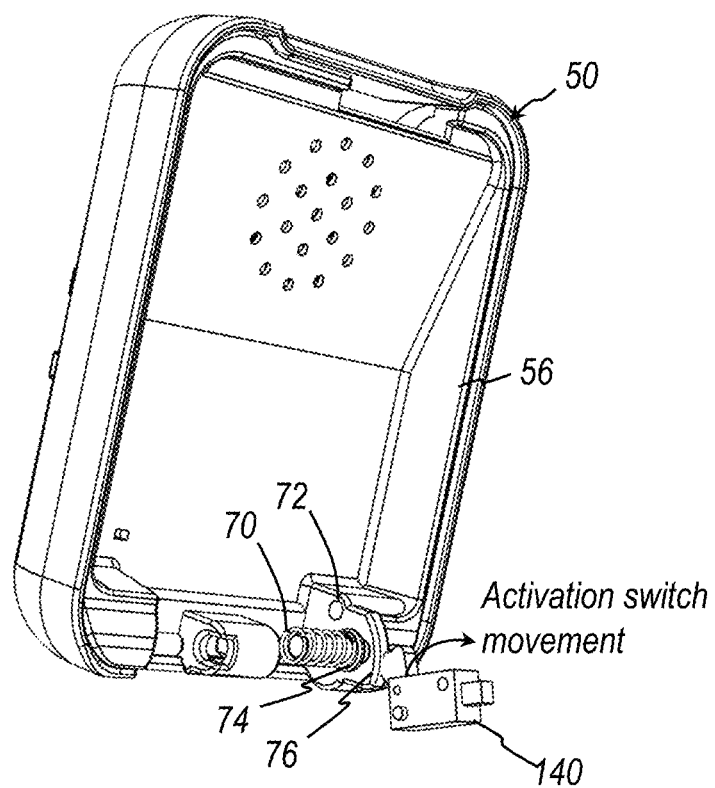

In this embodiment, the lid 50 is pivotally attached to the base 30. In other embodiments the lid 50 may be movably attached to the base 30 in another manner for moving between the closed and fully open positions. FIG. 13 shows the lid 50, and associated parts that are used to pivotally attach the lid 50 to the base 30 shown in FIG. 14. A pair of shafts 62 insert through apertures defined by the lid inner layer 56, with one of the apertures being defined by a boss 64 of the lid inner layer 56. The shafts 62 insert into aligned apertures defined by a boss 42 of the base 30 so as to form a hinge, permitting the lid 50 to pivot upwardly from the base 30. A torsion lid spring 68 has one end secured to the base 30, and another end secured to the lid inner layer 56, and biases the lid 50 toward the closed position. The lid inner layer 56 has a protrusion 57 that interferes with the base boss 42 to limit rotation of the lid 50 relative to the base 30 to the fully open position. A spring-loaded latch pin 70 has one end that is inserted into an aperture 44 defined by the base boss 42. The latch pin spring of the latch pin 70 biases the other end of the latch pin 70 against the lid boss 64. Referring to FIG. 18, when the lid 50 is in the closed position, the latch pin spring pushes the tip of latch pin 70 into a lid first aperture 72 to retain the lid 50 in the closed position. The tip of the latch pin 70 is chamfered, such that pivoting of the lid 50 forces the latch pin 70 to retract from the lid first aperture 72, against the biasing force of the latch pin spring. Referring to FIG. 8, when the lid 50 is partially open, the retracted latch pin 70 allows for pivoting of the lid 50 relative the base 30. Referring to FIG. 19, when the lid 50 is rotated to the maximum angle permitted by interference of the protrusion 57 with the base boss 42, the latch pin spring pushes the tip of the latch pin 70 into a lid second aperture 74 to retain the lid 50 in the fully open position. The lid 50 may be moved to the closed position by applying sufficient force to the latch pin 70 to cause the latch pin 70 to retract from the lid second aperture 74.

Flexible PCB.

Flexible PCBs are known in the art. In general, a flexible PCB 80 includes wiring and other electronic components attached to a flexible substrate, with non-limiting examples being a plastic material such as polyimide or polyether ketone (PEEK), or a conductive polyester. The present disclosure is not limited by any particular substrate, as long as it is sufficiently flexible to permit an oscillatory flapping motion of the PCB 80, as described in greater detail below. In embodiments, the flexible PCB 80 may have a thickness about 1.0 mm to 1.5 mm; other thicknesses may be suitable depending on the bending stiffness of the PCB 80, and the desired range of flapping motion of the PCB 80.

FIG. 16 shows a bottom plan view of an embodiment of a flexible PCB 80 used in the toy 10 of the present disclosure. A fixed end 82 of the PCB 80 has a pin connection that is used to operatively connect the PCB 80 to a circuit board of the controller 150. The free end 84 of the PCB 80 includes the operatively connected electromagnetic coil 88, the plurality of the LEDs 90, a metal foil 92 and a temperature sensor 94. A intermediate portion 86 of the PCB 80 is narrowed in width to increase the flexibility of the PCB 80. The width of the intermediate portion 80 may be selected having regard to considerations such as the desired flexibility of the PCB 80, the desired range of flapping motion of the PCB 80, and the desired durability and fatigue resistance of the PCB 80. As an example, the width of the intermediate portion 86 may be from about 10 mm to 18 mm. The fixed end 82 and free end 84 may be reinforced for strength with stiffening elements.

Flexible PCB: Electromagnetic Coil.

Electromagnetic coils and their principle of operation are known in the art. The electromagnetic coil 88 is wiring having a shape that produces a loop-shaped (e.g., circular) magnetic field when electric current flows through the wiring. To produce this effect, the wiring may be laid out in the shape of a circular coil, spiral or a helix as is known in the art. FIG. 16 shows a wiring layout for the electromagnetic coil 88, that includes a plurality of linear segments oriented in a plurality of different directions. In comparison with conventional circular wiring layouts, the layout in FIG. 16 may provide for higher strength of the magnetic field.

The coil 88 is positioned in proximity to the magnetically responsive member 20 such that the magnetic field of the coil 88 (when energized) will interact with the magnetically responsive member 20 at least within a portion of the range of motion of the PCB 80. If the magnetically responsive member 20 has a magnetic field (e.g., if the magnetically responsive member 20 is a permanent magnet), then its magnetic field will also interact with the magnetic field of the coil 88 (when energized). In use, the controller 150 is used to generate a coil control signal for the coil 88 to produce a time-varying varying magnetic field that interacts with the magnetically responsive member 20 to induce oscillatory flapping of the PCB 80. Oscillatory flapping of the PCB 80 refers to the PCB moving repeatedly in a first stroke direction (e.g., an upstroke direction) followed by a second stroke direction (e.g., a downstroke direction) opposite to the first stroke direction. The coil control signal may take a variety of forms that cause the strength of the electromagnetic coil's magnetic field to vary over time, with non-limiting examples including a pulse-width modulated waveform, or a sinusoidal wave form. The interaction between the time-varying magnetic field and the magnetically responsive member 20 may be either attractive or repulsive, or alternately attractive and repulsive in a cyclic manner by varying the direction of electric current flow through the coil 88 (e.g. alternating between positive current and negative current. It will therefore be understood that the processor 152 comprises or is operatively connected to the signal generator 182 that is capable of producing a coil control signal having a desired waveform in the coil 88. Signal generators are electronic devices that generate electrical signals have controlled properties (e.g. amplitude, frequency, waveform) and are known in the art. Signal generators may be analog or digital signal generators. The interaction of the magnetic field(s) acting on the PCB 80, along with combined with the elastic restoring tendencies of the flexible PCB 80 (and accounting for the self-weight of the PCB 80), will cause the PCB 80 to flap in an oscillatory manner. In this embodiment, the flapping movement of the PCB 80 is up and down relative to the fulcrum member 100. In other embodiments, the flapping movement may be in a different direction (e.g., side to side), depending on how the plane of the PCB 80, the fulcrum member 100 and the direction of the magnetic field(s) are arranged.

As the PCB 80 flaps in an oscillatory manner, so too will its plurality of LEDs 90. The frequency of the oscillatory flapping motion of the PCB 80 should be relatively rapid such that the illumination of LEDs 90 results in the optical illusion known as "persistence of vision" or "retinal persistence." That is, the human user perceives the illuminated rows of LEDs 90 as forming a composite image over a brief time interval, even though the LEDs 90 are actually moving along the oscillatory path over the time interval. In embodiments, the frequency of oscillatory flapping is at least 24 flaps per second. The person skilled in the art will be able to configure the toy 10 such that PCB 80 flaps at a desired frequency, having regard to parameters such as the strength of the magnetic field (if any) of the magnetically responsive member 20, the strength of the magnetic field produced by the electromagnetic coil 88, the properties of the coil control signal including its periodicity, and the mechanical properties of the PCB 80 including its stiffness and self-weight.

Flexible PCB: LEDs and LED Illumination Sequences.

The LEDs 90 illuminate in accordance with LED illumination sequences 156, under the control of a LED control signal generated by the controller 150. In this embodiment, the plurality of LEDs has thirty-two LEDs, but in other embodiments the plurality of LEDs may have any integer number of LEDs greater than or equal to two LEDs (e.g., a range of twenty-four to fifty LEDs). In this embodiment, the LEDs 90 are multi-color LEDs—that is, LEDs 90 are controllable to produce light in different colors, as well as controllable to illuminate in "on" and "off" states. In other embodiments, the LEDs 90 may be monochromatic, in which case different LEDs 90 may illuminate to produce light of the same or different colors. Further, in embodiments, the LEDs 90 may be dimmable—that is, the brightness of the LED can be varied by the parameters of a pulse width modulated (PWM) signal.

Figure 3:
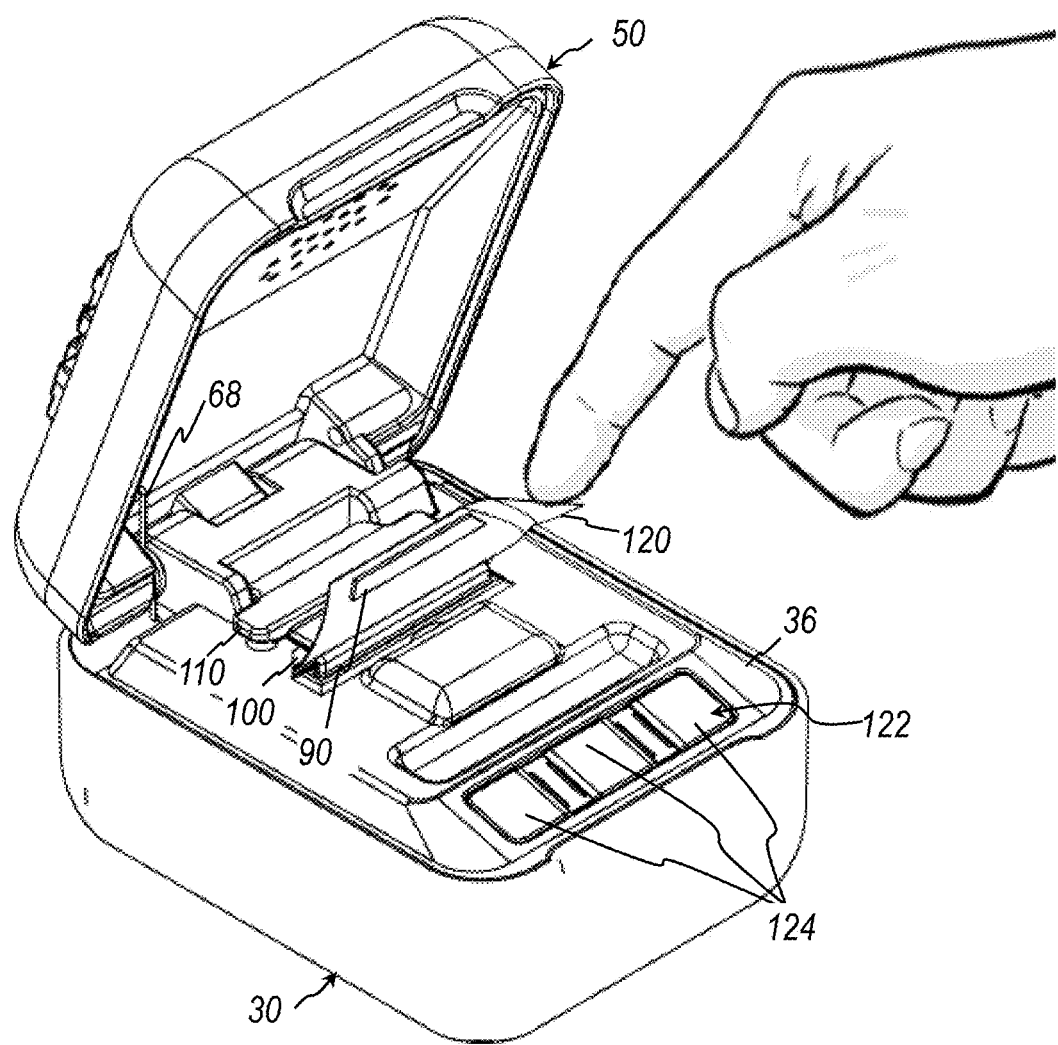

In the embodiment shown in FIG. 16, the LEDs 90 are disposed on the bottom side (i.e., the downward facing surface) of the PCB 80. In this manner, the LEDs 90 do not interfere with and are not interfered by a user's finger touching the touch sensor 120 on the top side (i.e., the upward facing surface) of the PCB 80, as shown in FIG. 3. The LEDs 90 may be arranged in a variety of ways on the plane of the PCB 80, as long as the LEDs 90 are distributed from each other in some direction. As a non-limiting example, in the embodiment shown in FIG. 16, the LEDs 90 are arranged in two linear rows that extend in a substantially horizontal direction, with the LEDs of one row being horizontal offset from the LEDs of the other row. In other embodiments, the LEDs 90 may be arranged along a non-linear topology.

Referring to FIG. 21, the LED illumination sequences 156 are stored in the memory 154. As used herein, the term "LED illumination sequence" refers to a series of illumination states of the LEDs 90, over a time interval. In an LED illumination sequence, the illumination states of the LEDs 90 may be defined by a series "on" and "off" states for each LED, over the time interval. In the case of multi-color LEDs 90, an LED illumination sequence may be additionally or alternatively defined by a series of color states for each LED, over the time interval. In the case of dimmable LEDs 90, an LED illumination sequence may be additionally or alternatively defined by a series of brightness states for each LED, over the time interval. The illumination states of different LEDs 90 may be the same as or different from each other, at any time within the time interval. The elapsed time of each illumination state in the series may be selected to produce a desired effect. As a non-limiting example, the series may be defined by 70 LED illumination states per second. In use, the LEDs 90 are illuminated while the PCB 80 is flapping. As discussed above, oscillatory flapping of the PCB 80 refers to the PCB moving repeatedly in a first stroke direction (e.g., an upstroke direction) followed by a second stroke direction (e.g., a downstroke direction) opposite to the first stroke direction. The LED control signal generated by the controller 150 to illuminate in accordance with the LED illumination sequence may be configured such that the LEDs 90 illuminate only when the PCB 80 moves in only one particular of the first and second stroke directions of its oscillation (e.g., an upstroke or a downstroke, but not both), or when the PCB 80 moves in both directions of its oscillation (e.g., both the upstroke and the downstroke). An LED control signal configured to illuminate the LEDs 90 when the PCB 80 moves only one of the stroke directions (e.g. either an upstroke direction or a downstroke direction, but not both) may prevent blurring of the image perceived by the user, particularly if PCB 80 moves slightly, in a cyclical manner, in a direction (e.g., the horizontal direction) that is transverse to the first and second stroke directions. Due to the "persistence of vision" effect, the LED illumination sequence 156 may be configured such that the human viewer perceives the illuminated LEDs 90 as an image of a recognizable object (e.g., a pet animal). Further, the LED illumination sequence 156 may be configured to vary over oscillations of the PCB 80 such that the human viewer perceives the illuminated LEDs 90 as an animated image.

Flexible PCB: Heat-Dissipating Metal Foil Layer and Temperature Sensor.

Prolonged flow of electric circuit through the coil 88 and the LCDs 90 may increase the temperature of the PCB 80 above acceptable levels. To mitigate this temperature increase, the PCB 80 includes an internal layer of metal foil 92 to distribute through the PCB 80 and dissipate heat from the PCB 80. In one embodiment, as shown in FIG. 17, the metal foil 92 is sandwiched between the substrate layers of the PCB 80. The metal foil 92 overlaps with the coil 88 and extends beyond the perimeter of the coil 88 to dissipate heat to portions of the PCB 80 beyond the perimeter of the coil 88. The metal foil 92 is preferably made of a metal having a relatively high thermal conductivity such as copper or aluminium.

The temperature sensor 94 is used to measure the temperature of the PCB 80. The temperature sensor 94 may be implemented by a variety of types of temperatures sensors that can be attached to or integrated with the PCB 80, including a NTC (negative temperature coefficient) thermistor or a PTC (positive temperature coefficient) thermistor, which are known in the art. As known in the art, the electrical resistance of a NTC thermistor decreases as the temperatures increase, whereas the electrical resistance of a PTC thermistor increases as the temperature increases, and thus can be used as a fuse in the circuitry of the PCB 80 to the electromagnetic coil 88. Other types of temperature sensors that may be used are digital thermistors (e.g. a metal oxide semiconductor based thermistors), and analog temperature sensors such as a thermocouple, The memory 154 may store instructions that are executable by the processor 152 of the controller 150 to monitor the temperature measured by the temperature sensor 94 and control a circuit interrupter switch 96 (FIG. 21) to interrupt the coil control signal to the coil 88 if the measured temperature of the PCB or a rate of an increase in the measured temperature of the PCB exceeds a predefined threshold value. The predefined threshold temperature value may be defined in absolute terms (e.g. 50 degrees Celsius), or defined by an increase in temperature relative to a temperature measured when the lid 50 is opened.

Fulcrum Member and Clamp Member.

Figure 15:
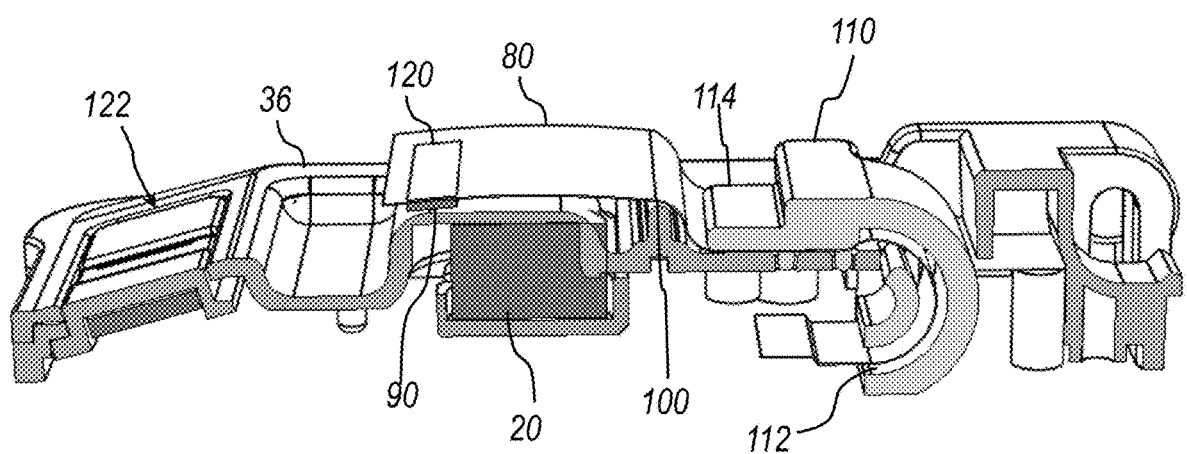

The fulcrum member 100 provides a structure against which the PCB 80 rests and from which the PCB 80 (including its constituent electromagnetic coil 88 and the plurality of LEDs 90) is cantilevered. That is, the PCB 80 extends from the fulcrum member 100 in an unsupported manner, such that the PCB 80 and its attached LEDs 90 can flap in an oscillatory manner relative to the fulcrum member 100. In the embodiment of FIG. 15, the fulcrum member 100 is in the form of a protrusion that extends vertically from the platform 36 of the base 30. The upper end of the fulcrum member 100 is rounded to facilitate bending of the PCB 80, without creasing the PCB 80. In other embodiments the fulcrum member 100 may be attached to another part of the toy 10, and be provided in another form. In the embodiment of FIGS. 27 to 29, for example, the fulcrum member 100 is formed by a ledge of the platform 36 of the base 30.

As previously noted, the LEDs 90 are distributed along some direction, which will be referred to as the "first direction". The cantilevered relationship of the PCB 80 to the fulcrum member 100 is configured such that the PCB 80 is flappable relative to the fulcrum member 100 to oscillate the LEDs 90 in a "second direction" that is at a non-zero angle relative to the first direction. As an example, in the embodiment shown in FIG. 16, the LEDs 90 are distributed along a substantially horizontal "first direction". The PCB 80 is cantilevered from the fulcrum member 100 such that when the PCB 80 flaps relative to the fulcrum member 100, the LEDs 90 oscillate in a substantially vertical "second direction", as shown in FIGS. 5 and 6.

The clamp member 110 may serve several purposes, including pressing the PCB 80 against the fulcrum member 100 and toward the magnetically responsive member 20, and controlling the oscillation amplitude of the PCB 80. In this embodiment, the clamp member 110 is required because the fixed end 82 of the PCB 80 is below the platform 36 for connection to the controller 150, and the PCB 80 extends upwardly above the platform 36. The PCB 80 is sufficiently stiff that its unbent "neutral" shape would project upward, at an oblique angle, from the platform 36 of the base 30. Accordingly, the clamp member 110 bends the PCB 80 downwardly from the neutral shape, such that the electromagnetic coil 88 of the PCB 80 is closer to the magnetically responsive member 20. In other embodiments, the clamp member 110 may be omitted depending on how the PCB 80 is secured to the rest of the toy 10, and the geometry of the PCB 80 and the magnetically responsive member 20.

In the embodiment of FIG. 15, the clamp member 110 defines a curved channel 112 for routing the intermediate portion 86 from the topside of the platform 36, to the under side of the platform 36 for connection to the controller 150 (FIGS. 8 and 20). The clamp member 110 is secured to the platform 36 by bolts extending upwardly through apertures in the platform 36 into the clamp member 110. The clamp member 110 defines a foot 114 that is horizontally spaced apart from the fulcrum member 100, and that contacts the upper surface of the PCB 80 and presses the PCB 80 downwardly against the upper surface of the platform 36, as well as the fulcrum member 100. The foot 114 assists with the PCB 80 moving downwardly when the PCB is at the amplitude of its motion and the magnetic attraction force between the electromagnetic coil 88 and the magnetically responsive member 20 may be at a minimum. In embodiments, such as shown in FIG. 15, the width of the foot 114 may be approximately equal to the width (e.g. 10 mm to 18 mm) of the intermediate portion 86 of the PCB 80. In other embodiments, such as shown in FIG. 31, the width of the foot 114 may be substantially less than the width of the intermediate portion 86 of the PCB. By selecting the cantilevered length of the PCB 80, the geometry and relative position of the fulcrum member 100 and the clamp member 110, the flapping performance (e.g., amplitude and angular range of flapping) of the PCB 80 may be tuned to desired effect.

Oscillatory Flapping of PCB.

As an example, FIGS. 5 and 6 show an embodiment of the toy 10 with the PCB 80 at the lower extent and upper extent, respectively, of the oscillation. In moving from the lower extent in FIG. 5 to the upper extent in FIG. 6, the PCB 80 may have an angular displacement of about 90 degrees, and the LEDs 90 may move a vertical distance of about millimeters. The latter measurement is effectively a dimension of an image that can be displayed by the LEDs 90 when oscillating.

Referring to FIG. 28, the dashed lines show the PCB 80 at the extents of its angular range of motion. The oscillatory flapping motion of the PCB 80 may be defined angular changes, $\alpha$ and $\beta$, in opposing direction with respect to the neutral position of the PCB 80. The "neutral position" refers to the resting position of the PCB 80 when it is not subject to any magnetic field of the magnetically responsive member 20. In embodiments, the scalar values of $\alpha$ and $\beta$ may be the same as each other, or different from each other. In one non-limiting example, the scalar values of $\alpha$ and $\beta$ may be 75 degrees and 15 degrees, respectively, for a total angular range of motion of about 90 degrees. In another non-limiting example, the scalar values of $\alpha$ and $\beta$ may both be about 45 degrees, for a total angular range of motion of about 90 degrees. For a given total angular range of motion, it may be preferable for the scalar values of $\alpha$ and $\beta$ to be similar or the same, to minimize the maximum stress to which the PCB 80 is subjected. As shown in Figs. And 28, the lower extent of the motion of the PCB 80 may be limited by the PCB 80 contacting a limiting protrusion 39 of the platform 36 of the base 30.

Alternative Embodiment: Rigid PCB with Electromagnetic Coil and LEDs

In embodiments, the toy 10 of the present invention may be implemented with a rigid PCB rather than a flexible PCB 80. Rigid PCBs are known in the art. In general, a rigid PCB includes wiring and other electronic components attached to a rigid substrate, with a non-limiting example being resin-coated glass fiber. In order to produce the oscillatory flapping effect, a rigid PCB must be pivotally attached to the base 30, whereas the flexible PCB 80 can simply bend about a fixed point. FIG. 30 shows an embodiment of a toy 10 having a rigid PCB 190 rather than a flexible PCB 80. It will be understood that the rigid PCB 190 includes an electromagnetic coil 88 (not shown) and LEDs 90, in a manner analogous to the flexible PCB 80 described above. One end of the rigid PCB 190 is securely held or attached to a holding member 192. As an example, the holding member 192 may be implemented by members similar to the fulcrum member 100 and clamp member 110 as described above. The holding member 192 is attached to the base 30 by a connecting pin 194, thus permitting the rigid PCB 90 to pivot relative to the base, as shown by the curved arrow line and dashed line representation of the rigid PCB 90 in a raised position. A spring 196 (referred to herein as a "PCB spring" to distinguish it from other springs of the toy 10) biases the rigid PCB 190 either away from or toward the base 30, when the rigid PCB 190 is displaced from a neutral position. The PCB spring 196 may be a compression spring as shown in the embodiment of FIG. 30, or a torsion spring in other embodiments. Interaction between the time-varying magnetic field of the electromagnetic coil 88 and the magnetically responsive member 20 induces oscillatory flapping of the rigid PCB 190, accounting for the biasing effect of the PCB spring 196. To overcome the biasing effect the PCB spring 196, it may be necessary to use a relatively strong permanent magnet for the magnetically responsive member 20.

Although not shown, in embodiments, the flexible PCB 80 may also be pivotally attached to the base 30 in a manner analogous to the rigid PCB 190 shown in FIG. 30. In such embodiments, the oscillatory flapping of the flexible PCB 80 may be attributable to a combination of bending of the flexible PCB 80, pivoting of the flexible PCB 80 relative to the base 30, and the biasing effect of a PCB spring 196.

Touch Sensors.

The touch sensors 120, 122 detect tactile user interaction with the toy 10, by generating a touch signal when touched by the user. Touch sensors 120, 122 may be implemented by a variety of sensor types, including capacitive touch sensors, resistive touch sensors, infrared (IR) touch sensors, and surface acoustic wave (SAW) sensors; such sensors and their principal of operation are known in the art. Embodiments of the toy 10 may have a single touch sensor, or a plurality of touch sensors to provide multiple touch points for user interaction.

In the embodiment shown in FIG. 1, the toy 10 has two physically discrete touch sensors 120, 122. A first touch sensor 120 is attached to the PCB 80, and more particularly, the topside (i.e., upward facing surface) of the PCB 80. Accordingly, this touch sensor 120 may be referred to herein as a "PCB-mounted" touch sensor to differentiate it from the "fixed touch" sensor 122. Insofar as the LEDs 90 of the PCB 80 are used to display a pet, touching the touch sensor 120 attached to the PCB 80 can provide a simulated experience of touching the pet.

A second touch sensor 122 is secured to the platform 36, and the base 30 more generally. As the fulcrum 100 is stationary in relation to the base 30 as a whole, this touch sensor 122 may be referred to herein as a "fixed" touch sensor to differentiate it from the "PCB-mounted" touch sensor 120. The second touch sensor 122 is formed from three discrete sub-sensors 124 arranged in a horizontal row that are separated by grooves, or may be formed from a single elongate sensor. In other embodiments, one or more touch sensors may be placed additionally or alternatively on different parts of the toy 10. For instance, they may be positioned on the outer surface of the base 30 or the lid 50.

In conjunction with the controller 150, the touch sensors 120, 122 can be used to detect a touch, a touch gesture (e.g., a "swipe" or "slide" of a user's finger across the touch sensors 120, 122), or a touch duration (e.g., how long a user's finger remains in contact with the touch sensors 120, 122). The configuration of touch sensors and a processor to detect a touch, a touch gesture and a touch duration is known in the art. The controller 150 may use the detection of a touch, a touch gesture, or a touch duration as a basis for selecting among the LED illumination sequences 156 for output by the LEDs 90, or for selecting among the audio files 158 for output by the audio transducer 130.

Audio Transducer and Audio Files.

The audio transducer 130 is used to output sounds in accordance with stored audio files 158, under the control of an audio control signal generated by the controller 150. In the embodiment shown in FIG. 2, the audio transducer 130 is implemented by a loud speaker disposed in the compartment 58 defined by the lid 50. Referring to FIG. 21, the audio files 158 are stored in the memory 154, such as in digital format. Different audio files 158 encode different sounds such as musical sequences, vocalized speech, or sound effects.

Motion Sensor.

The motion sensor 132 is used to generate motion signals in response to motion of the toy 10. In embodiments, the motion sensor 132 may include a ball switch sensor, which can detect orientation and inclination of the toy 10 as well as motion of the toy 10. Ball switch sensors are known in the art, and generally include a metallic ball that rolls within a tube to engage or disengage electrical contacts within the tube. In other embodiments, the motion sensor 132 may be implemented by other types of motion sensors known in the art, such as MEMS accelerometers.

Mechanical Activation Switch Actuated by Lid.

The mechanical activation switch 140 is switchable between an off-state and an fully on-state, corresponding to lid 50 being in the closed position, and a fully open position, respectively. In embodiments, the activation switch 140 may be switchable to an intermediate on-state, corresponding to the lid 50 being in a partially open position, such as shown in FIGS. 7 and 8. The off-state, fully on-state, and intermediate on-state of the activation switch 140 are detectable by the controller 150 to either terminate or initiate oscillatory flapping of the PCB 80, or may be used as a basis for selecting among the LED illumination sequences 156 for output by the LEDs, or for selecting among the audio files 158 for output by the audio transducer 130.

Referring to the embodiment shown in FIGS. 8, 18 and 19, the mechanical activation switch 140 is implemented by a tactile switch attached to the base 30. As the lid 50 pivots relative to the base 30 from the closed position (FIG. 18) to the partially open position (FIG. 8) to the fully open position (FIG. 19), a cam 74 defined by the lid inner layer 56 engages a pivoting portion of the activation switch 140 to actuate the switch from an off-state (FIG. 18), to an intermediate on-state (FIG. 8), to a fully on-state (FIG. 19). Conversely, as the lid 50 pivots relative to the base 30 from the fully open position to the partially open position to the closed position, the cam 74 engages the activation switch 140 to actuate the activation switch 140 from the on-state to the intermediate on-state to the off-state. The activation switch 140 may be configured such that it is actuated between the off-state and the intermediate on-state as shown in FIGS. 7 and 8 when the lid 50 has pivoted to the partially open position, by a certain angle from the closed position toward the fully open position. As a non-limiting example, in the partially open position, the angular change in orientation of the lid 50 may be about 10 degrees to 15 degrees from the orientation of the lid 50 in the closed position; in the fully open position, the angular change in orientation of the lid 50 may be about 70 to 80 degrees from the orientation of the lid 50 in the closed position. As discussed below, oscillatory flapping of the PCB 80 may be initiated when the lid 50 is in the partially open position, such that a user of the toy will see the PCB 80 in movement whenever the lid 50 is open.

Controller.

FIG. 21 shows the operative connection (represented by dashed lines) of the controller 150 to a power supply 180, the electromagnetic coil 88, the LEDs 90, the touch sensors 120, 122, the audio transducer 130, the motion detector 132, and the mechanical activation switch 140. The power supply 180 may be one or more batteries, or in other embodiments, may be another source of electrical power (e.g., an electrical power supply adapter).

The controller 150 includes at least one processor 152 and at least one memory 154. In one embodiment, the processor 152 and memory 154 are implemented by a microcontroller 150 unit (MCU)—that is, an integrated chip having one or more processing cores and one or more memories. The MCU is connected to a circuit board such as shown by the controller 150 in FIG. 20, which has operative connections (e.g., data bus connections, pin connectors, soldered connections, and the like) to the other electronic components shown in FIG. 21. In such an embodiment, the memory 154 may be a read-only memory that stores firmware that is installed at the time of manufacture.

The firmware includes a set of LED illumination sequences 156, and a set of audio files 158, as previously described. The firmware also includes a set of instructions that are executable by the processor 152. Parts of those instructions are shown notionally as modules in FIG. 21. A coil control module 160 generates a coil control signal to control the electromagnetic coil 88 to produce the time-varying magnetic field that interacts with the magnetically responsive member 20 to induce oscillatory flapping of the PCB 80. An LED control module 162 generates an LED control signal to control the LEDs 90 to illuminate in accordance with the LED illumination sequences 156. An audio control module 164 generates an audio control signal to control the audio transducer 130 to output sound in accordance with the audio files 158. A touch detection module 166 analyzes and/or responds to touch signals from the touch sensors 120, 122 to detect the toy 10 being touched, being touched with a particular gesture (e.g., a swipe or slide gesture), or being touched with a specified duration. A motion detection module 168 analyzes and/or responds to motion signals from the motion sensor 132 to detect movement of the toy 10, or a particular type of movement (e.g., shaking or tilting) of the toy 10. A switch detection module 170 analyzes and/or responds to switch signals dependent on the state of the activation switch 140 to detect whether the activation switch 140 is in the off-state, the intermediate state, or the on-state. A play response module 172 in conjunction with one or more of the foregoing modules encodes subroutines that control the toy 10 to respond to user interactions. Examples of such subroutines are described in the below examples. Any one or more of the subroutines may be implemented in combination with each other, in any order.

Figure 22:
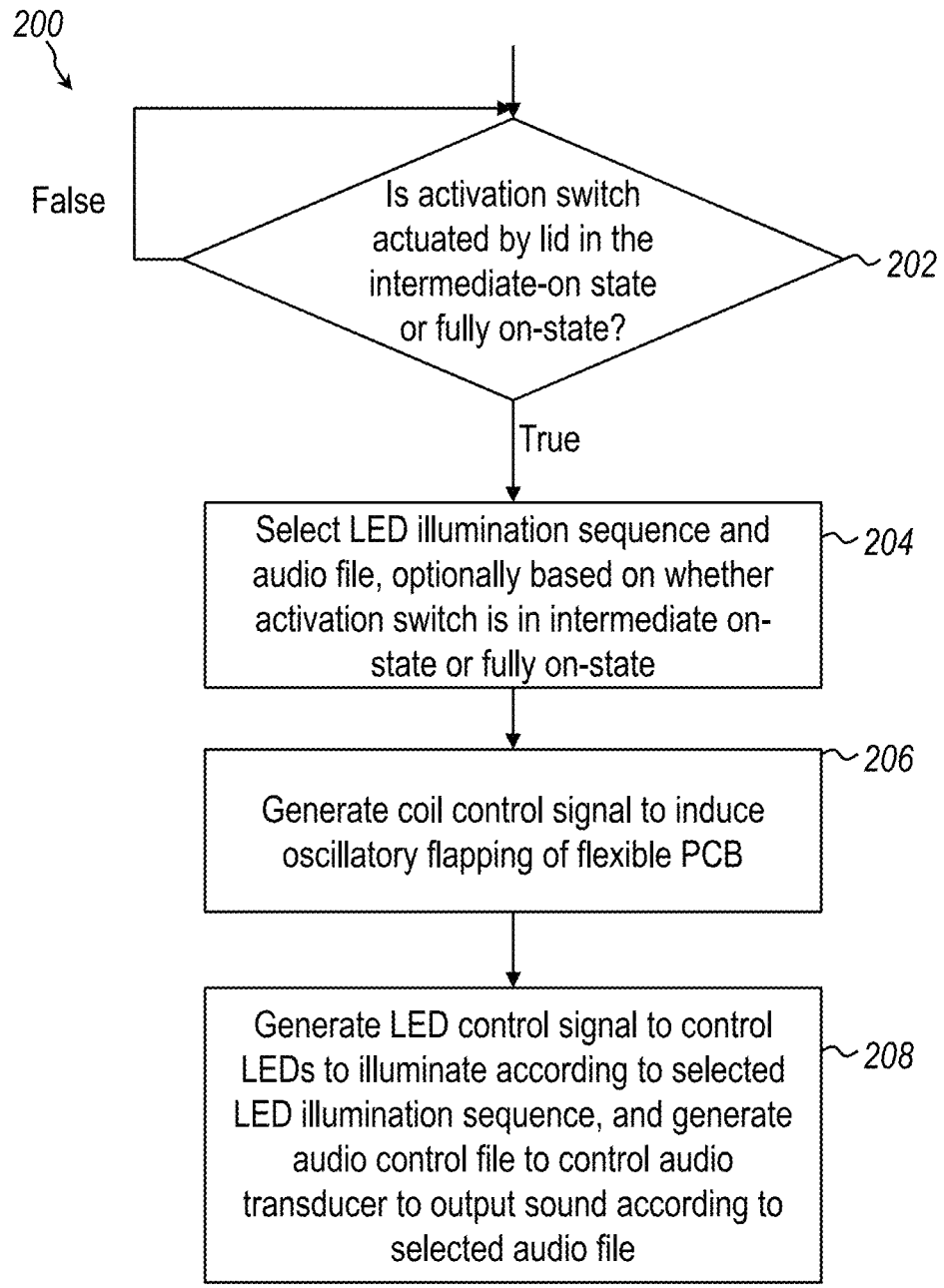
FIG. 22 is a flow chart of an exemplary subroutine implemented by the controller of the toy for response to the lid of the toy being opened.

Example No. 1: Control of Toy for Response to Lid being Partially or Fully Opened FIG. 22 shows a subroutine 200 implemented by the controller 150 for response to the lid 50 being partially opened, such as shown in FIGS. 7 and 8, or fully opened such as shown in FIGS. 1 to 6. At step 202, the controller 150 analyzes and/or responds to a signal to determine whether the activation switch 140 is in the intermediate on-state or the fully on-state, corresponding to the lid 50 being in the partially open position or the fully open position, respectively. If the activation switch 140 is in the off-state, then the method returns to step 202. Otherwise, if the activation switch 140 is in the intermediate on-state or the fully on-state, then at step 204 the controller 150 selects one of the LED illumination sequences 156, and optionally, one of the audio files 158. These selections may be made in accordance with the set of instructions stored by the memory 154. In embodiments, the selection may depend on whether the activation switch 140 is in the intermediate on-state or the fully on-state, to provide different play patterns. For example, the LED illumination sequences 156 and audio files 158 selected when the lid 50 is moved to the partially open position actuating the intermediate on-state of the activation switch 140. This may be used to configure the toy for a "try me" phase when the toy 10 is displayed on store shelves in retail packaging that allows a user to see an image or animation displayed by the oscillating LEDs 10, without fully opening the lid 50. In contrast, the LED illumination sequences 156 and audio files 158 that are selected when the lid 50 is in the fully open position actuating the fully on-state of the activation switch 140, may differ from those that are used during the "try me" phase. This may be used to configure the toy 10 for a "play phase" that prompts or responds to user interactions with the toy 10 in a particular manner, such as by touching the touch sensors 120, 122 or moving the toy 10. In other embodiments, the instructions stored by the memory 154 may program the controller 150 to use one of the LED illumination sequences 156 and one of the audio files 158, without making a selection per se. At step 206, the controller 150 controls the signal generator 182 to generate a coil control signal in the coil 88 to induce a time-varying magnetic field in the coil 88, which interacts with the magnetically responsive member 20 to induce oscillatory flapping of the PCB 80 and its LEDs 90. Step 208 is performed at the same time as step 206. At step 208, the controller 150 generates an LED control signal to control the LEDs 90 to illuminate in accordance with the selected LED illumination sequence 156. If the controller 150 selected one of the audio files 158 at step 204, then at step 208, the controller 150 also generates an audio control signal to control the audio transducer 130 to output a sound in accordance with the selected audio file 158. In a variation of the subroutine, step 204 is performed before step 202, and steps 206 and 208 are performed after step 202 if the condition in step 202 evaluates as true.

It will be apparent that subroutine 200 may be augmented with further steps to deactivate flapping of the PCB 80 when the lid 50 is closed and actuates the activation switch 140 to the off-state. In this manner, the augmented subroutine can control the toy 10 such that oscillatory flapping of the PCB 80 is activated only when the lid 50 is in the partially open position and the fully open position, and not when the lid 50 is in the closed position.

Figure 25A:
FIGS. 25A to 25F show exemplary user interactions with and responses of an embodiment of a toy of the present invention.

FIG. 25A illustrates an exemplary application of subroutine 200. The controller 150 selects an LED illumination sequence 156 that displays the animation of a pet dog, and an audio file 158 encoding a vocalized reading of the greeting "Ruff". The LEDs 90 display the pet dog, and the audio transducer 130 outputs the sound "Ruff" after the lid 50 is opened.

Worded another way, the toy 10 optionally further comprises an activation switch 140 actuatable by the processor 152 from an off-state to a fully on-state by moving of the lid 50 from the closed position to the fully open position. When the activation switch 140 is in the fully on-state, the processor 152 is programmed to carry out a first set of functions. The first set of functions may be a set of functions associated with ownership of the toy 10. For example, the first set of functions may include receiving input from the at least one touch sensor and generating the LED control signal to control illumination of the LEDs 90 in accordance with a first one of the LED illumination sequences based on the input from the at least one touch sensor. Optionally, the activation switch 140 is actuated from the off-state to a partially on-state by moving of the lid 50 from the closed position to an angle of 10 degrees to 15 degrees from the closed position towards the fully open position, wherein, when the activation switch 140 is in the partially on-state, the processor 152 is programmed to carry out a second set of functions that is different than the first set of functions. The second set of functions may be a set of functions associated with a try-me mode for the toy, while the toy 10 is not yet owned by the user (e.g. while the toy 10 sits in a store prior to purchase). For example, the second set of functions may include generating the LED control signal to control illumination of the LEDs 90 in accordance with a second one of the LED illumination sequences without regard to input from the at least one touch sensor. Worded more broadly, the activation switch 140 may be said to be actuatable from the off-state to a partially on-state by moving of the lid 50 from the closed position to a partially open position, wherein, when the activation switch 140 is in the partially on-state, the processor 152 is programmed to carry out a second set of functions that is different than the first set of functions, wherein the activation switch 140 is further actuatable to the fully on-state by moving the lid 50 from the partially open position to the fully open position; and wherein the method further comprises, in response to detecting the activation switch being in the fully on-state, generating another LED control signal to control illumination of the LEDs 90 in accordance with another one of the LED illumination sequences.

Example No. 2: Control of Toy for Response to Toy being Touched

Figure 23:
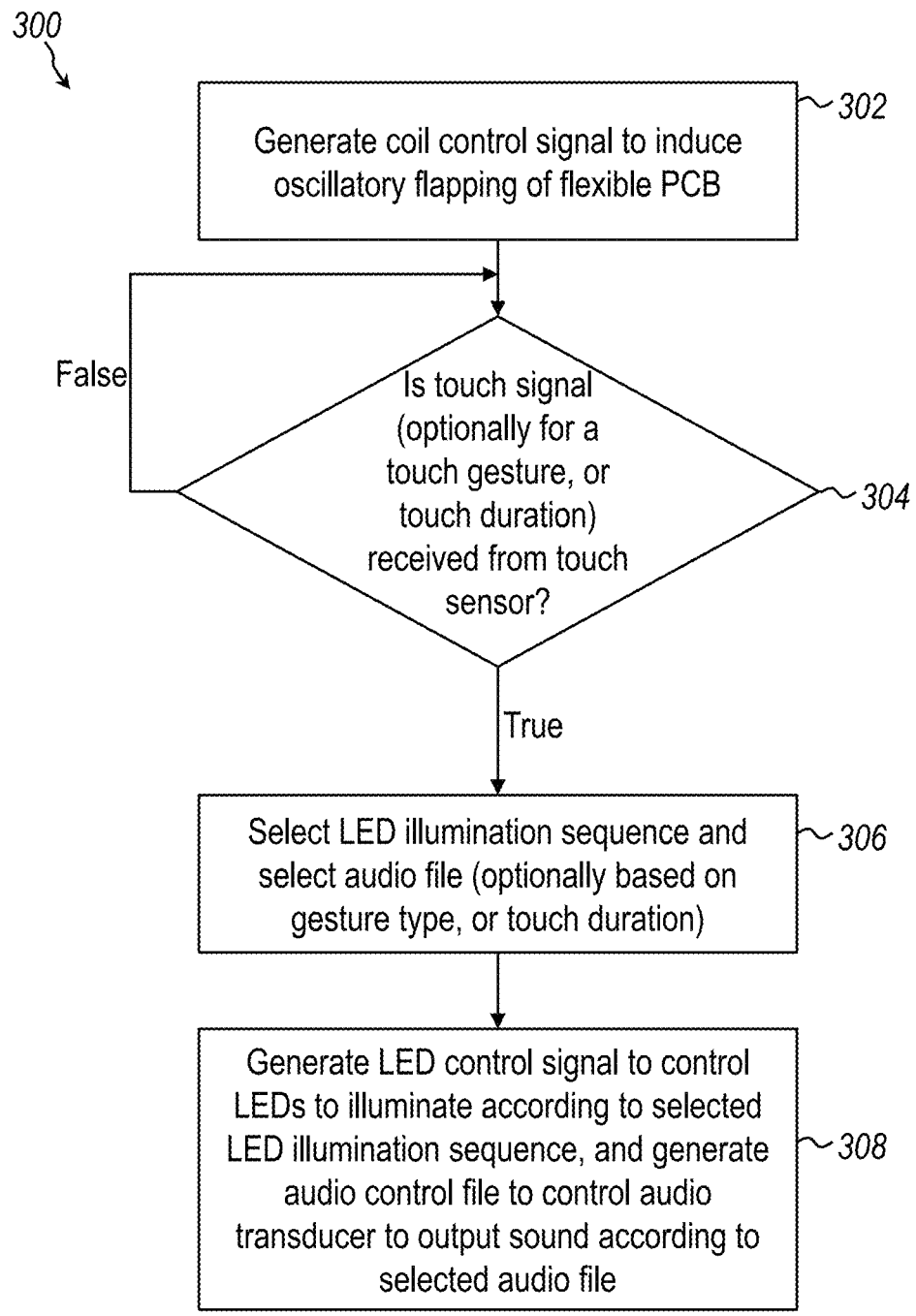
FIG. 23 is a flow chart of an exemplary subroutine implemented by the controller of the toy for response to the toy being touched.
Figure 24:
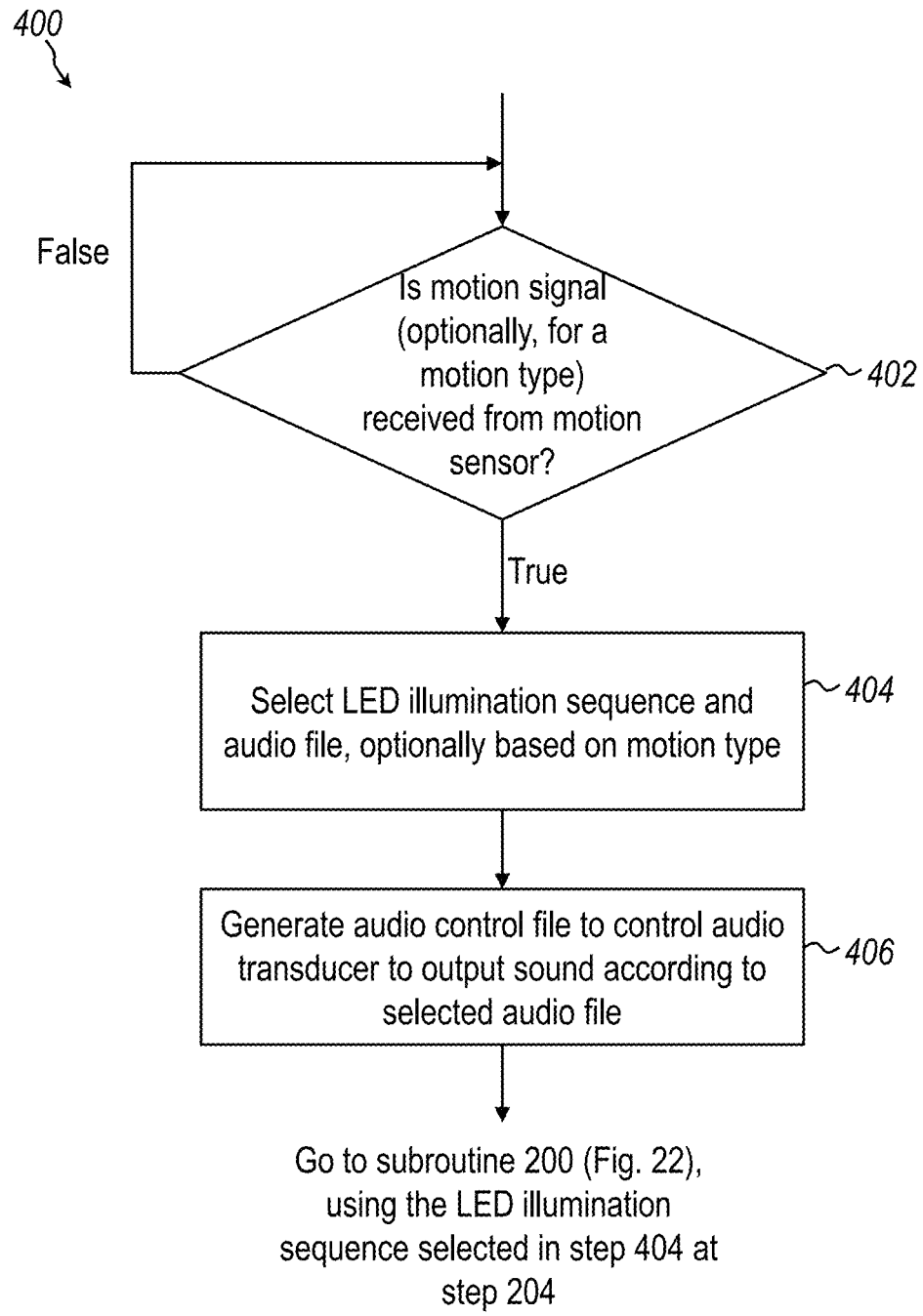
FIG. 24 is a flow chart of an exemplary subroutine implemented by the controller of the toy for response to the toy being moved.

FIG. 23 shows a subroutine 300 implemented by the controller 150 for response to one of the touch sensors 120, 122 being touched. At step 302, the controller 150 controls the signal generator 182 to generate a coil control signal in the coil 88 to induce a time-varying magnetic field in the coil 88, which interacts with the magnetically responsive member 20 to induce oscillatory flapping of the PCB 80 and its LEDs 90. (Step 302 may be performed as a continuation of step 206 in subroutine 200.) At step 304, the controller 150 analyzes and/or responds to a touch signal from the touch sensor to determine whether the toy 10 is touched. This evaluation may involve determining if the toy 10 was touched with a particular gesture (e.g., a swipe gesture in a particular direction), or a specified touch duration (e.g., one second or more). If no touch signal was received, then the method returns to step 304. Otherwise, if a touch signal is received, then at step 306 the controller 150 selects one of the LED illumination sequences 156, and optionally, one of the audio files 158. These selections may depend on the detection of a particular touch gesture in step 304. That is, the detection of different touch gestures may result in the selection of different LED illumination sequences 156 and audio files 158, in accordance with a stored rule. Step 308 is performed at the same time as step 302. These selections may be made in accordance with the set of instructions stored by the memory 154. In other embodiments, the instructions stored by the memory 154 may program the controller 150 to use one of the LED illumination sequences 156 and one of the audio files 158, without making a selection per se. At step 308, the controller 150 generates an LED control signal to control the LEDs 90 to illuminate in accordance with the selected LED illumination sequence 156. If the controller 150 selected one of the audio files 158 at step 306, then at step 308, the controller 150 also generates an audio control signal to control the audio transducer 130 to output a sound in accordance with the selected audio file 158.

Figure 25B:
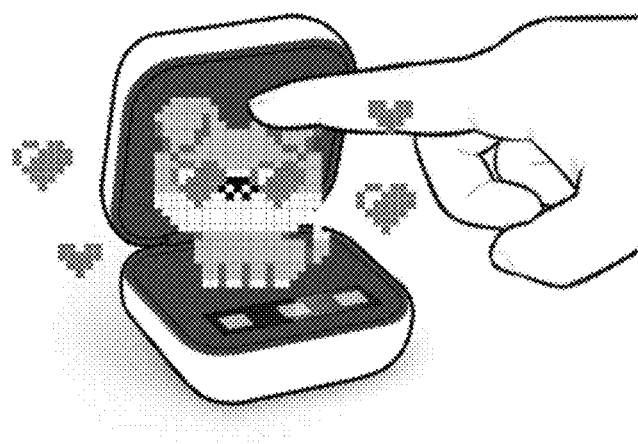

FIG. 25B illustrates one exemplary application of subroutine 300 when the touch sensor 120 on the PCB 80 is touched to simulate petting of a dog. In response to this touching, the controller 150 selects an LED illumination sequence 156 to control the LEDs 90 to display an animation of a dog emoting an affectionate response, as symbolized by images of hearts.

Figure 25C:
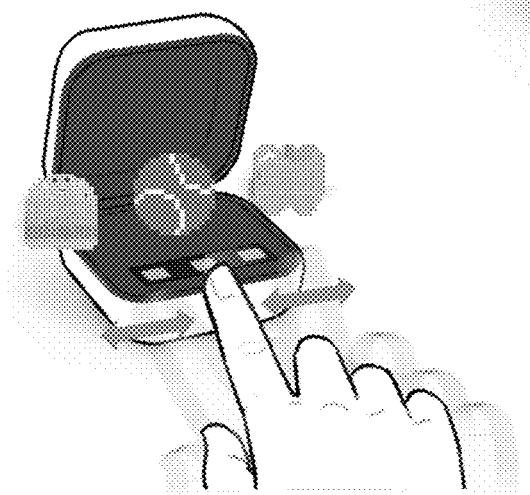

FIG. 25C illustrates another exemplary application of subroutine 300 when the touch sensor 122 attached to the platform 36 is touched with a swiping gesture. Depending on whether the user swipes left or right on the touch sensor 122, the controller 150 selects different LED illumination sequences 156 to display different pet toys or treats. For example, the LEDs 90 are controlled to initially display the image of a tennis ball. If the user swipes to the right, the LEDs 90 display a hamburger. If the user swipes to the left, the LEDs display an apple.

Figure 25D:
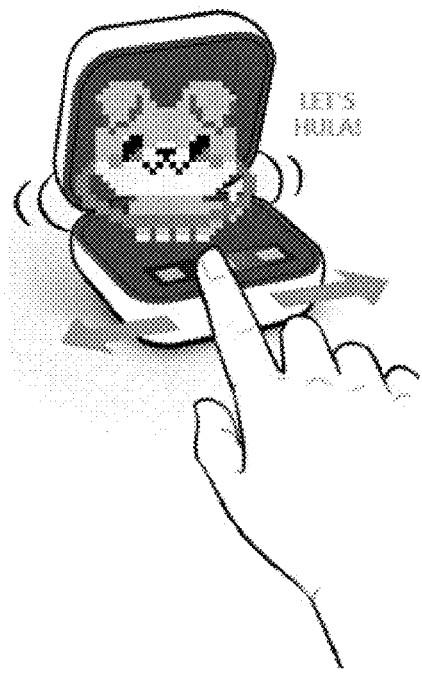

FIG. 25D illustrates still another exemplary application of subroutine 300 when the touch sensor 122 on the platform 36 is touched with a swiping gesture. In response to the user swiping alternately left and right on the touch sensor, the controller 150 selects an LED illumination sequence 156 to control the LEDs 90 to display an animation of a dog playing with a hula hoop, and selects an audio file 158 to control the audio transducer 130 to output a vocalized reading of "Let's Hula!".

Example No. 3: Control of Toy for Response to Toy being Moved

FIG. 23 shows an example of a subroutine 400 implemented by the controller 150 for response to the toy 10 being moved. At step 402, the controller 150 analyzes and/or responds to a motion signal receives from the motion sensor 132 to determine whether the toy 10 is moved. This evaluation may determine if the toy 10 was moved in a particular manner (e.g., shaken, or tilted back and forth in a particular direction). If no motion was detected, then the method returns to step 402. Otherwise, if motion was detected, then at step 404, the controller 150 selects one of the LED illumination sequences 156, and optionally, one of the audio files 158. These selections may depend on the detection of a movement in step 402. That is, the detection of different movements (e.g., shaking as opposed to tilting) may result in the selection of different LED illumination sequences 156 and audio files 158, in accordance with a stored rule. In other embodiments, the instructions stored by the memory 154 may simply program the controller 150 to use one of the LED illumination sequences 156 and one of the audio files 158, without making a selection per se. At step 406, the controller 150 generates an audio control signal to control the audio transducer 130 to output a sound in accordance with selected audio file 158. Step 406 may be performed when the lid 50 is either closed or open, or both. The subroutine then performs steps analogous to subroutine 200, with it being understood that the LED illumination sequence 156 selected at step 404 is used for the selection at step 204.

Figure 25E:
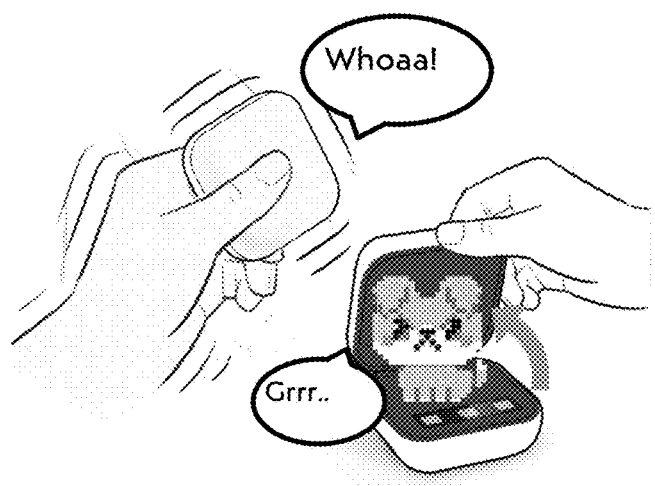

FIG. 25E illustrates one exemplary application of subroutine 400 when the toy 10 is shaken. In response to a detected shaking motion, the controller 150 selects an LED illumination sequence 156 to control the LEDs 90 to display an animation of a dog emoting with a sad face after the lid 50 is opened. The controller 150 also selects two different audio files 158 to control the audio transducer 130 to output different sounds when the lid 50 is closed and when the lid 50 is fully opened. When the lid 50 is closed, the audio transducer 130 outputs an vocalized reading of "Whoaa!" in accordance with a first selected audio file 158. When the lid 50 is closed, the audio transducer 130 outputs an vocalized reading of "Grrr . . . " in accordance with a second selected audio file 158.

Figure 25F:
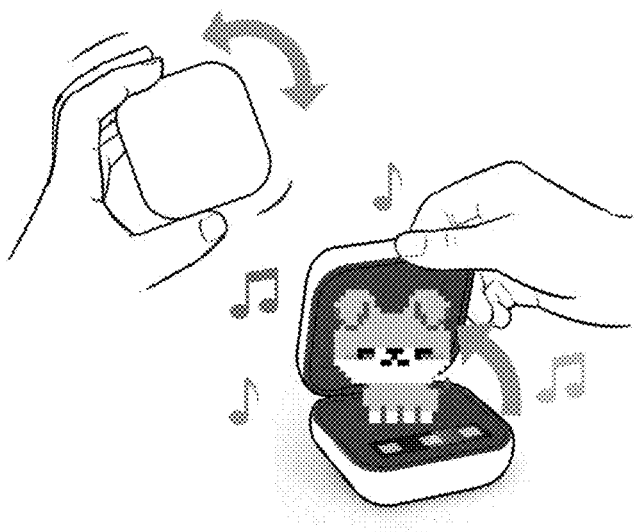

FIG. 25F illustrates another exemplary application of subroutine 400 when the toy is tilted back and forth. In response to a detected tilting motion, the controller 150 selects an LED illumination sequence 156 to control the LEDs 90 to display an animation of a dancing dog, and selects an audio file 158 to control the audio transducer 130 to output music, after the lid 50 is opened.

PARTS LIST

10 Toy
20 Magnetically responsive member
30 Base
32 Base, battery compartment
34 Base, battery compartment cover
35 Base, screw for battery compartment cover
36 Base, platform
38 Base, platform recess
39 Base, platform, limiting protrusion
40 Base, controller compartment
42 Base, boss
50 Lid
52 Lid, outer shell
53 Lid, outer shell, finger recess
54 Lid, insert
56 Lid, inner layer
57 Lid, inner layer protrusion
58 Lid, audio transducer compartment
59 Lid, inner recess for flexible PCB
60 Lid, apertures for audio transducer
62 Lid, shafts for attachment to base
64 Lid, boss
68 Lid, lid spring
70 Lid, spring-loaded latch pin
72 Lid, first aperture for spring-loaded latch pin
74 Lid, second aperture for spring-loaded latch pin
76 Lid, cam for actuating activation switch
80 Flexible PCB
82 Flexible PCB, fixed end
84 Flexible PCB, free end
86 Flexible PCB, intermediate portion
88 Flexible PCB, electromagnetic coil
90 Flexible PCB, LEDs
92 Flexible PCB, metal foil layer
94 Flexible PCB, temperature sensor
96 Flexible PCB, circuit interrupter switch
100 Fulcrum member
110 Clamp member
112 Clamp member, channel
114 Clamp member, foot
120 Touch sensor, PCB-mounted
122 Touch sensor, fixed relative to fulcrum member on base
122 Touch sensor, on base, sub-sensor
130 Audio transducer
132 Motion sensor
140 Activation switch, actuated by lid
150 Controller
152 Controller, processor
154 Controller, memory
156 Memory, stored LED illumination sequences
158 Memory, stored audio files
160 Memory, coil control module
162 Memory, LED control module
164 Memory, audio control module
166 Memory, touch detection module
168 Memory, motion detection module
170 Memory, switch detection module
172 Memory, play response module
180 Power supply
182 Signal generator
190 PCB, flexible or rigid
192 Holding member for PCB
194 Connecting pin
196 Spring for PCB (PCB spring)
200-208 Subroutine responsive to the lid of the toy being opened, and steps thereof
300-308 Subroutine responsive to the toy being touched, and steps thereof
400-406 Subroutine responsive to the toy being moved, and steps thereof

What is claimed is:

1. A toy comprising:
   a magnetically responsive member;
   a base;
   a printed circuit board (PCB) comprising an electromagnetic coil, and a plurality of light emitting diodes (LEDs) distributed in a first direction, wherein the PCB is attached to the base such that the PCB is flappable relative to the base to oscillate the LEDs through an oscillation in a second direction at a non-zero angle relative to the first direction;
   at least one touch sensor for generating at least one touch signal when touched by a user;
   a signal generator operatively connected to the electromagnetic coil to generate a coil control signal in the electromagnetic coil; and
   a controller comprising:
      a processor operatively connected to the PCB, the at least one touch sensor, and the signal generator; and
      a memory comprising a non-transitory computer readable medium storing:
         a plurality of different LED illumination sequences for the plurality of LEDs, wherein each of the LED illumination sequences comprises a series of illumination states for the LEDs; and
         a set of instructions executable by the processor to implement a method comprising:
            (i) controlling the signal generator to generate the coil control signal in the electromagnetic coil to produce a time-varying varying magnetic field that interacts with the magnetically responsive member to induce oscillatory flapping of the PCB and the attached plurality of LEDs through the oscillation relative to the base; and
            (ii) in response to detecting the touch signal, and during step (i), generating a LED control signal to control illumination of the LEDs in accordance with at least one of the LED illumination sequences,
         wherein the at least one touch sensor comprises at least one PCB-mounted touch sensor that is attached to the PCB such that, in use, the at least one PCB-mounted touch sensor flaps in unison with the PCB relative to the base.

2. The toy of claim 1, wherein the PCB is a flexible PCB, the toy comprises a fulcrum member attached to the base, the flexible PCB is cantilevered from the fulcrum member, and the flexible PCB is flappable relative to the base by bending of the PCB relative to the fulcrum member.

3. The toy of claim 2, wherein the base defines a substantially horizontal platform, wherein the fulcrum member extends upwardly from the platform, wherein the toy further comprises a clamp member horizontally spaced apart from the fulcrum member, and pressing the PCB downwardly against an upper surface of the platform and the fulcrum member.

4. The toy of claim 3, wherein the clamp member defines a channel extending from above the platform to below the platform, wherein the PCB extends through the channel, and is attached to the processor below the platform.

5. The toy of claim 1, wherein the PCB is either a flexible PCB or a rigid PCB, the PCB is pivotally attached to the base, the toy further includes a spring for biasing the PCB either away from or toward the base, and the PCB is flappable relative to the base by pivoting relative to the base.

6. The toy of claim 1, wherein the magnetically responsive member is a permanent magnet.

7. The toy of claim 1, wherein the at least one touch sensor comprises a plurality of touch sensors on the base, wherein the method further comprises selecting the at least one of the LED illumination sequences that is used in step (ii) based on which of the touch sensors generated the touch signal.

8. The toy of claim 1, wherein, in step (ii), the detected touch signal is indicative of the at least one touch sensor being touched with a swipe gesture.

9. The toy of claim 1, wherein the at least one PCB-mounted touch sensor is attached to an upward facing surface of the PCB.

10. The toy of claim 1, wherein the plurality of LEDs are disposed on a downward facing surface of the PCB.

11. The toy of claim 10, wherein the method further comprises selecting another one of the LED illumination sequences, based on a type of motion indicated by the motion signal, wherein the type of motion comprises either a shaking motion or a tilting motion.

12. The toy of claim 1, wherein the at least one touch sensor comprises at least one fixed touch sensor that is fixedly attached to the base.

13. The toy of claim 1, wherein:
the toy further comprises a motion sensor for detecting motion of the toy; and
the method comprises, in response to detecting a motion signal generated by the motion sensor, and during step (i), generating another LED control signal to control the plurality of LEDs to illuminate in accordance with another one of the LED illumination sequences.

14. The toy of claim 1, wherein:
the toy further comprises an audio transducer;
the memory further stores a plurality of different audio files; and
the method comprises, in response to detecting the touch signal generated by the at least one touch sensor, generating an audio control signal to control the audio transducer to output sound in accordance with one of the audio files.

15. The toy of claim 1, wherein the toy further comprises a lid movably attached to the base and is movable between a closed position in which the lid covers the PCB to prevent the PCB being viewed from outside the housing, and a fully open position in which the housing exposes the PCB to viewing from outside the housing, wherein the toy further comprises an activation switch actuatable by the processor from an off-state to a fully on-state by moving of the lid from the closed position to the fully open position, wherein, when the activation switch is in the fully on-state, the processor is programmed to carry out a first set of functions.

16. The toy of claim 15, wherein the lid is pivotally attached to the base, and the activation switch is actuated from the off-state to a partially on-state by moving of the lid from the closed position to an angle of 10 degrees to 15 degrees from the closed position towards the fully open position, wherein, when the activation switch is in the partially on-state, the processor is programmed to carry out a second set of functions that is different than the first set of functions.

17. The toy of claim 15, wherein:
the activation switch is actuatable from the off-state to a partially on-state by moving of the lid from the closed position to a partially open position,
wherein, when the activation switch is in the partially on-state, the processor is programmed to carry out a second set of functions that is different than the first set of functions;
the activation switch is further actuatable to the fully on-state by moving the lid from the partially open position to the fully open position; and
the method further comprises, in response to detecting the activation switch being in the fully on-state, generating another LED control signal to control illumination of the LEDs in accordance with another one of the LED illumination sequences.

18. The toy of claim 1, wherein the base defines a substantially horizontal platform, wherein the PCB extends upwardly from the platform, wherein the platform defines a platform recess that receives the LEDs to prevent contact between the LEDs and the platform when the PCB is at a lower extent of the oscillation relative to the base.

19. The toy of claim 18, wherein the platform, in use, is contacted by the PCB to limit a lower extent of the oscillation relative to the base.

20. The toy of claim 1, wherein in step (i), the oscillatory flapping of the PCB includes the PCB moving repeatedly in a first stroke direction followed by a second stroke direction opposite to the first stroke direction; and wherein in step (ii), the LED control signal is configured to illuminate the LEDs when the LEDs move in either the first stroke direction or the second stroke direction, but not both the first and second stroke directions.

21. The toy of claim 1, wherein the PCB comprises an internal metal foil layer that overlaps with the electromagnetic coil, and extends beyond a perimeter of the electromagnetic coil to dissipate heat from the electromagnetic coil to portions of the PCB beyond the perimeter of the electromagnetic coil.

22. The toy of claim 1, wherein the toy further comprises a temperature sensor attached to the PCB to measure a temperature of the PCB, and a circuit interrupter switch for interrupting the coil control signal to the coil,
wherein the processor is operatively connected to the temperature sensor and to the circuit interrupter switch, and
wherein the method further comprises the processor controlling the circuit interrupter switch to interrupt the coil control signal to the coil in response to the temperature of the PCB or a rate of an increase the temperature of the PCB exceeding a predefined threshold value.

23. A toy comprising:
a magnetically responsive member;
a base;
a printed circuit board (PCB) comprising an electromagnetic coil, and a plurality of light emitting diodes (LEDs) distributed in a first direction, wherein the PCB is attached to the base such that the PCB is flappable relative to the base to oscillate the LEDs through an oscillation in a second direction at a non-zero angle relative to the first direction;

at least one touch sensor for generating at least one touch signal when touched by a user;

a signal generator operatively connected to the electromagnetic coil to generate a coil control signal in the electromagnetic coil; and a controller comprising:
  a processor operatively connected to the PCB, the at least one touch sensor, and the signal generator; and
  a memory comprising a non-transitory computer readable medium storing:
  a plurality of different LED illumination sequences for the plurality of LEDs, wherein each of the LED illumination sequences comprises a series of illumination states for the LEDs; and
  a set of instructions executable by the processor to implement a method comprising:
    (i) controlling the signal generator to generate the coil control signal in the electromagnetic coil to produce a time-varying varying magnetic field that interacts with the magnetically responsive member to induce oscillatory flapping of the PCB and the attached plurality of LEDs through the oscillation relative to the base; and
    (ii) in response to detecting the touch signal, and during step (i), generating a LED control signal to control illumination of the LEDs in accordance with at least one of the LED illumination sequences,
  wherein the base defines a substantially horizontal platform, wherein the PCB extends upwardly from the platform, wherein the platform defines a platform recess that receives the LEDs to prevent contact between the LEDs and the platform when the PCB is at a lower extent of the oscillation relative to the base.

24. The toy of claim 23, wherein the magnetically responsive member is a permanent magnet.

25. The toy of claim 23, wherein the plurality of LEDs are disposed on a downward facing surface of the PCB.

26. The toy of claim 23, wherein the at least one touch sensor comprises at least one fixed touch sensor that is fixedly attached to the base.

27. The toy of claim 23, wherein the toy further comprises a lid movably attached to the base and is movable between a closed position in which the lid covers the PCB to prevent the PCB being viewed from outside the housing, and a fully open position in which the housing exposes the PCB to viewing from outside the housing, wherein the toy further comprises an activation switch actuatable by the processor from an off-state to a fully on-state by moving of the lid from the closed position to the fully open position, wherein, when the activation switch is in the fully on-state, the processor is programmed to carry out a first set of functions.

28. The toy of claim 27, wherein the lid is pivotably attached to the base, and the activation switch is actuated from the off-state to a partially on-state by moving of the lid from the closed position to an angle of 10 degrees to 15 degrees from the closed position towards the fully open position, wherein, when the activation switch is in the partially on-state, the processor is programmed to carry out a second set of functions that is different than the first set of functions.

29. The toy of claim 27, wherein:
  the activation switch is actuatable from the off-state to a partially on-state by moving of the lid from the closed position to a partially open position,
  wherein, when the activation switch is in the partially on-state, the processor is programmed to carry out a second set of functions that is different than the first set of functions;
  the activation switch is further actuatable to the fully on-state by moving the lid from the partially open position to the fully open position; and
  the method further comprises, in response to detecting the activation switch being in the fully on-state, generating another LED control signal to control illumination of the LEDs in accordance with another one of the LED illumination sequences.

* * * * *